United States Patent
Nansei

(10) Patent No.: US 8,536,048 B2
(45) Date of Patent: Sep. 17, 2013

(54) METHOD OF MANUFACTURING ELECTRONIC COMPONENT

(75) Inventor: Hiroyuki Nansei, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 299 days.

(21) Appl. No.: 12/882,649

(22) Filed: Sep. 15, 2010

(65) Prior Publication Data

US 2011/0070713 A1 Mar. 24, 2011

(30) Foreign Application Priority Data

Sep. 24, 2009 (JP) .................................. 2009-219579

(51) Int. Cl.
*H01L 21/4763* (2006.01)

(52) U.S. Cl.
USPC ............................ 438/622; 438/669; 438/737

(58) Field of Classification Search
USPC ............... 438/3, 102–103, 98, 717, 736–738, 438/622, 669
See application file for complete search history.

(56) References Cited

U.S. PATENT DOCUMENTS

| | | |
|---|---|---|
| 2004/0209459 A1 | 10/2004 | Awaya |
| 2008/0017996 A1 | 1/2008 | Sato et al. |
| 2009/0134432 A1 | 5/2009 | Tabata et al. |
| 2011/0204459 A1* | 8/2011 | Gaidis ........................... 257/421 |

FOREIGN PATENT DOCUMENTS

| | | |
|---|---|---|
| CN | 1612318 A | 5/2005 |
| JP | 2007-281198 | 10/2007 |
| JP | 2008-27991 | 2/2008 |
| JP | 2008-166726 | 7/2008 |
| JP | 2008-171918 | 7/2008 |
| JP | 2008-186868 | 8/2008 |
| JP | 2008-192857 | 8/2008 |
| JP | 2008-218573 | 9/2008 |
| JP | 2008-258458 | 10/2008 |
| JP | 2009-16400 | 1/2009 |

OTHER PUBLICATIONS

Korean Office Action issued Dec. 7, 2011, in Patent Application No. 10-2010-0084147.
U.S. Appl. No. 13/601,494, filed Aug. 31, 2012, Fukumizu, et al.
Office Action issued Dec. 20, 2012, in Chinese Patent Application No. 201010275292.1 with English translation.
Taiwanese Office Action issued on Mar. 19, 2013, in Taiwanese Patent Application No. 099127343 (with English Translation).

* cited by examiner

*Primary Examiner* — Thanhha Pham
(74) *Attorney, Agent, or Firm* — Oblon, Spivak, McClelland, Maier & Neustadt, L.L.P.

(57) ABSTRACT

According to one embodiment, a lower wiring layer is formed by using a sidewall transfer process for forming a sidewall film having a closed loop along a sidewall of a sacrificed or dummy pattern and, after removing the sacrificed pattern to leave the sidewall film, selectively removing the base material with the sidewall film as a mask. One or more upper wiring layers are formed in an upper layer of the lower wiring layer via another layer using the sidewall transfer process. Etching for cutting each of the lower wiring layer and the upper wiring layers is collectively performed, whereby closed-loop cut is applied to the lower wiring layer and the upper wiring layers.

16 Claims, 19 Drawing Sheets

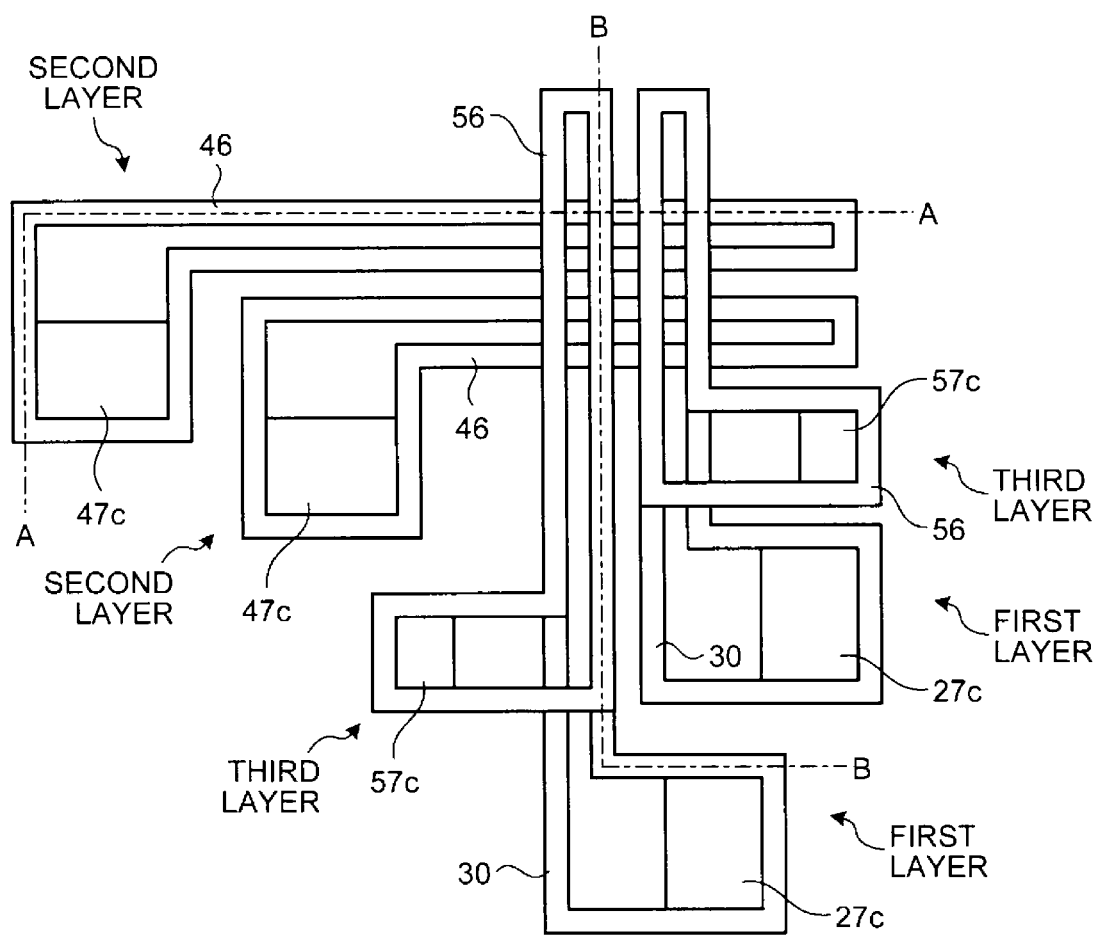

METHOD OF MANUFACTURING ELECTRONIC COMPONENT

CROSS-REFERENCE TO RELATED APPLICATIONS

This application is based upon and claims the benefit of priority from Japanese Patent Application No. 2009-219579, filed on Sep. 24, 2009; the entire contents of which are incorporated herein by reference.

FIELD

Embodiments described herein relate generally to a method of manufacturing an electronic component.

BACKGROUND

In the past, in manufacturing of an electronic component, when a wire is formed by a so-called sidewall transfer process, a sidewall is formed to surround a core material. In other words, the sidewall is formed in a closed loop shape. To process a wiring material with the sidewall as a mask and transfer a pattern of the sidewall to the wiring material, the wire is also formed in the closed loop shape. To use the wire having the closed-loop shape as a normal wire, for example, in Japanese Patent Application Laid-Open No. 2008-27991, a process called closed loop cut for cutting a closed loop to form a wire is carried out.

However, the closed-loop cut process is performed once for each layer of the wire. Therefore, when an electronic component having a plurality of layers of wires formed by the sidewall transfer process is manufactured, the number of steps increases. In particular, the number of used masks increases. The influence of such a problem is conspicuous in manufacturing of, for example, a resistive random access memory (ReRAM).

BRIEF DESCRIPTION OF THE DRAWINGS

FIGS. 2A to 2C are schematic diagrams for explaining an example of the method of manufacturing a nonvolatile storage device according to the first embodiment;

DETAILED DESCRIPTION

In general, according to one embodiment, a method of manufacturing an electronic component attained as follows. a lower wiring layer is formed by using a sidewall transfer process for forming, on a base material, a sidewall film having a closed loop along a sidewall of a sacrificed pattern and, after removing the sacrificed pattern to leave the sidewall film, selectively removing the base material with the sidewall film as a mask. One or more upper wiring layers are formed in an upper layer of the lower wiring layer via another layer using the sidewall transfer process. Etching for cutting each of the lower wiring layer and the upper wiring layers is collectively performed, whereby closed-loop cut is applied to the lower wiring layer and the upper wiring layers.

Exemplary embodiments of a method of manufacturing an electronic component will be explained below in detail with reference to the accompanying drawings. The present invention is not limited to the following embodiments. In drawings referred to below, for facilitation of understanding, in some case, scales of members are different from actual scales. The scales of the members are also different among the drawings.

Figure 1A:
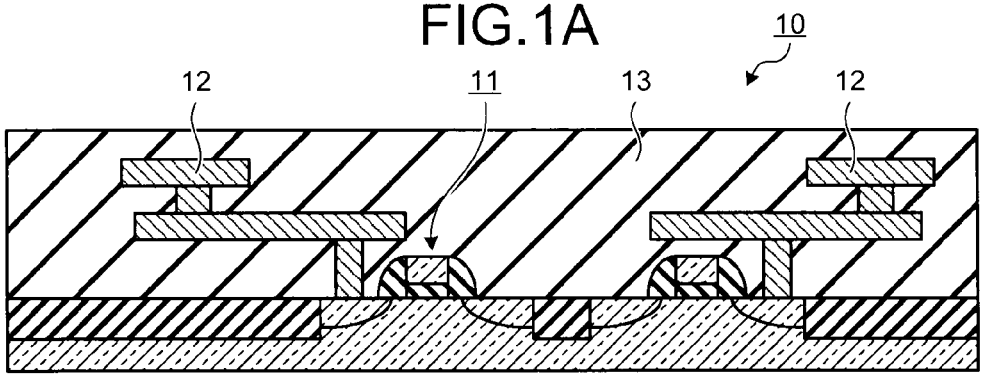
FIGS. 1A to 1Q are schematic sectional views for explaining an example of a method of manufacturing a nonvolatile storage device according to a first embodiment.
Figure 1B:
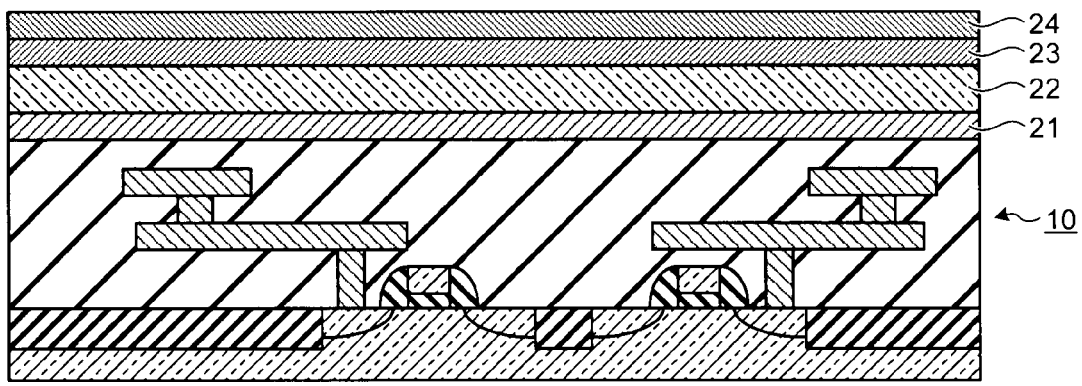
Figure 1C:
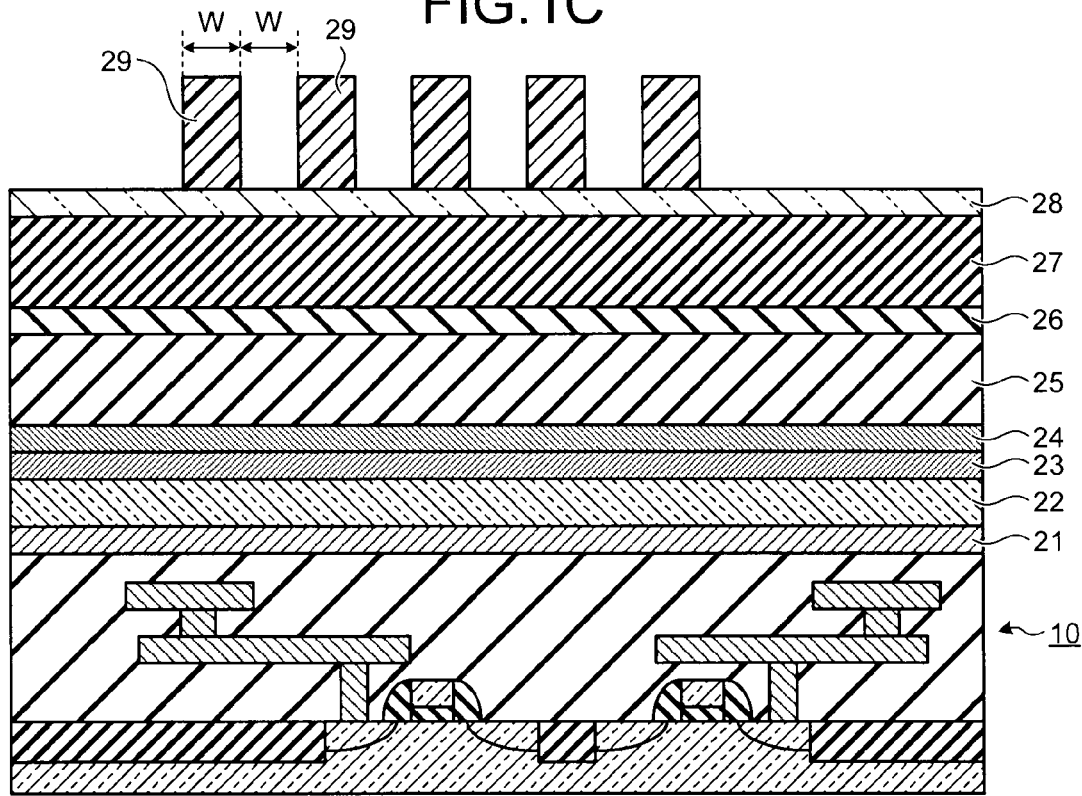
Figure 1D:
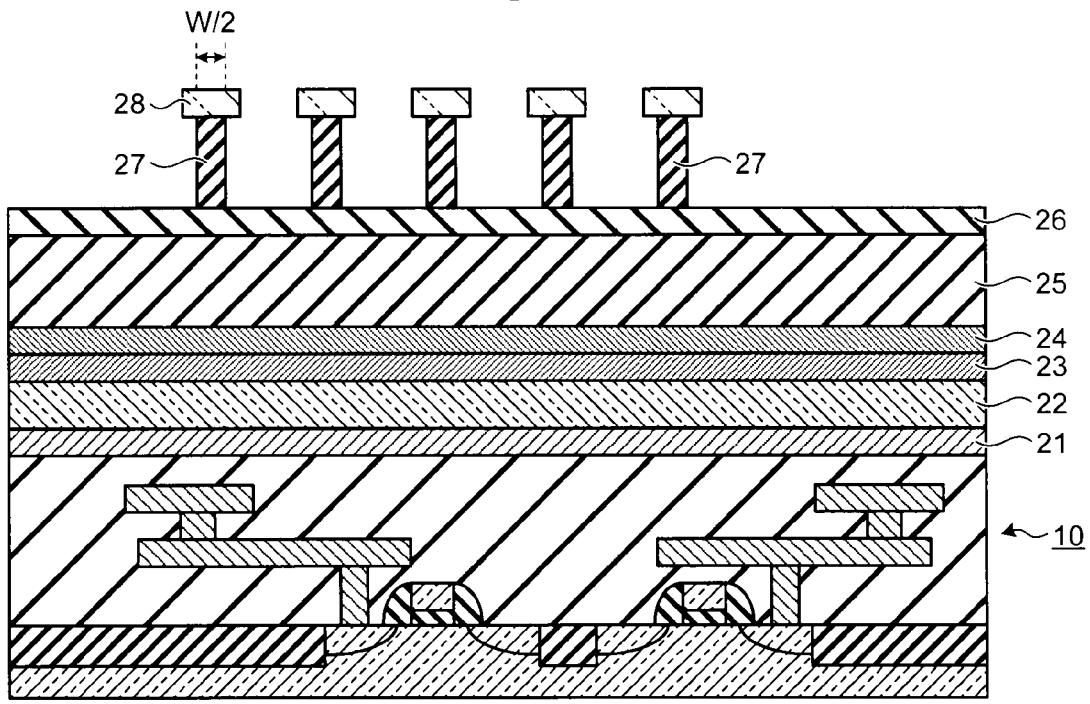
Figure 1E:
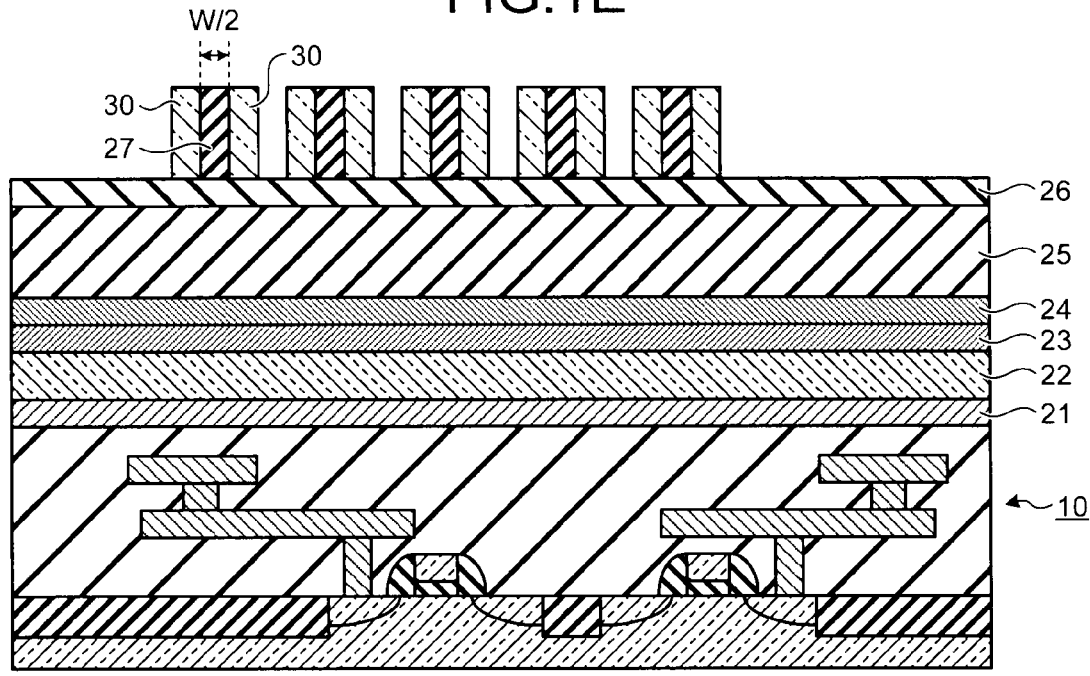
Figure 1F:
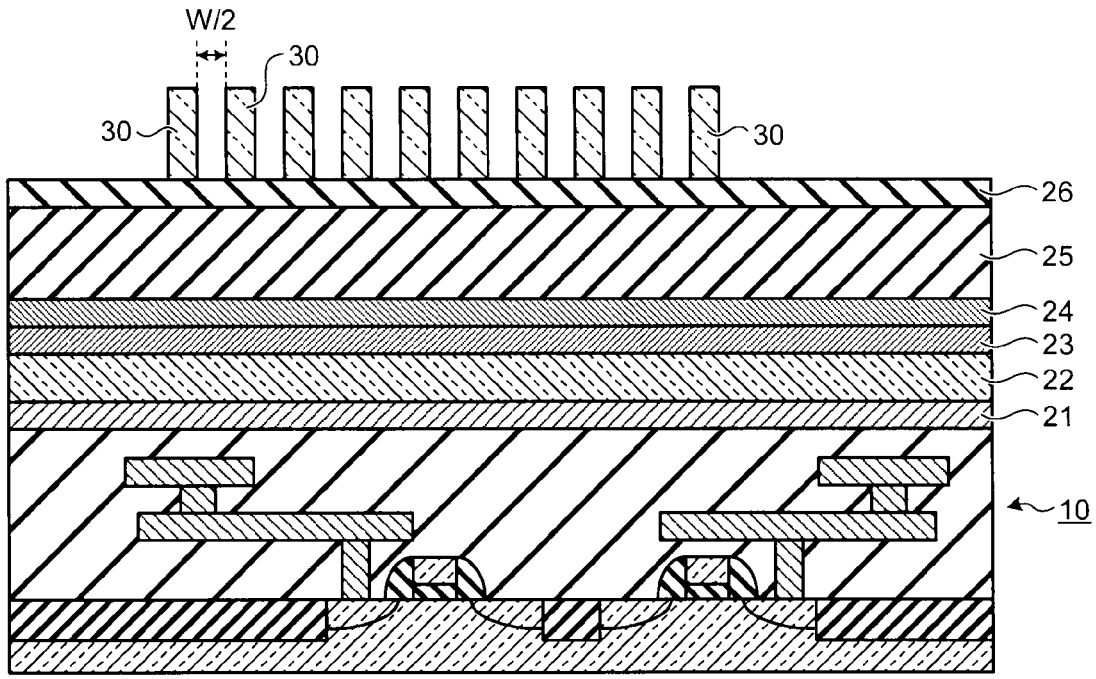

In a first embodiment, as a method of manufacturing a nonvolatile storage device in which a plurality of layers of wiring layers are formed by using a sidewall transfer technology, a method of manufacturing a cross-point type ReRAM having a memory cell including a rectifying element (a diode) and a variable resistance element (a nonvolatile storage element) is explained. FIGS. 1A to 1Q are schematic sectional views of an example of a procedure of a method of manufacturing a nonvolatile storage device according to the first embodiment.

First, a semiconductor substrate 10 on which transistor elements 11 and wires 12 are formed by a publicly-known method is prepared as a base layer (FIG. 1A). In the semiconductor substrate 10, as shown in FIG. 1A, the transistor elements 11 on a semiconductor wafer and the wires 12 connected to the transistor elements 11 are buried by a silicon oxide film serving as an insulating layer 13. The surface of the semiconductor substrate 10 is planarized by the CMP processing.

Subsequently, a first element layer is formed. First, a tungsten film 21 to be a first wiring layer (a lower wiring layer) for the cross-point type ReRAM is formed by a film forming method such as the sputtering method or the chemical vapor deposition (CVD) method. It is desirable to form not-shown barrier metals such as titanium nitride films on and under the tungsten film 21. Adhesion between a base layer and an upper layer is improved and mixing of substances in upper and lower layers due to spread can be prevented by forming the barrier metals on and under the tungsten film 21.

A polysilicon film 22 to be a first diode as a rectifying element is formed on the tungsten film 21 by a film forming method such as the CVD method. The polysilicon film 22 can be caused to operate as a diode by laminating a P-type polysilicon film, an I-type polysilicon film, and an N-type polysilicon film in order from the lower layer side (the tungsten film 21 side) or the upper layer side to form the polysilicon film 22.

A variable resistance layer 23 to be a first variable resistance element is formed on the polysilicon film 22 by a film forming method such as the sputtering method. The variable resistance layer 23 is made of a variable resistance material, a plurality of resistance states (e.g., a high-resistance state and a low-resistance state) of which can be switched. As the variable resistance material, a substance, a resistance state of which changes according to voltage applied to both ends. For example, a material containing at least one substance selected out of a group including Ti-doped $NiO_x$, C, $NbO_x$, Cr-doped $SrTiO_{3-x}$, $Pr_xCa_yMnO_z$, $ZrO_x$, $NiO_x$, $ZnO_x$, $TiO_x$, $TiO_xN_y$, $CuO_x$, $GdO_x$, $CuTe_x$, $HfO_x$, $ZnMn_xO_y$, and $ZnFe_xO_y$ can be used. Chalcogenide $GeSb_xTe_y$ (GST), N-doped GST, O-doped GST, GeSb, $InGe_xTe_y$, or the like, a resistance state of which changes according to Joule heat generated by the voltage applied to both the ends can also be use. It is desirable to form not-shown barrier metals such as titanium nitride films on and under the variable resistance layer 23. Adhesion between a base layer and an upper layer is improved and mixing of substances in upper and lower layers due to spread can be prevented by forming the barrier metals on and under the variable resistance layer 23. The variable resistance element can also have a configuration in which the variable resistance layer 23 is sandwiched by electrode layers. A tungsten film 24 is formed on the variable resistance layer 23 by a film forming method such as the sputtering method or the CVD method. (FIG. 1B). The tungsten film 24 functions as a stopper during the CMP processing in a later step.

In this state, first sidewall transfer processing is performed as explained below. First, a silicon oxide film 25 functioning as both a base protective layer and a hard mask material is formed on the tungsten film 24 by using the CVD method. A silicon nitride film 26 is formed on the silicon oxide film 25 by using the CVD method.

Subsequently, a silicon oxide film 27 to be a core material during the sidewall transfer processing is formed on the silicon nitride film 26 by using the CVD method. An amorphous silicon film 28 to be a mask material during processing of the core material is formed on the silicon oxide film 27 by using the CVD method. Resist patterns 29 are formed on the amorphous silicon film 28 by the lithography technology. At this point, in a memory cell array region, multiples resist patterns 29 having Line/Space=W/W when a half pitch is W are formed (FIG. 1C).

The amorphous silicon film 28 is processed by the reactive ion etching (hereinafter, "RIE") method to transfer patterns of the resist patterns 29 onto the amorphous silicon film 28. Ashing is performed to ash and remove the resist patterns 29.

The silicon oxide film 27 as the core material is processed and patterned by the RIE method with the patterned amorphous silicon film 28 as a mask. The patterned silicon oxide film 27 is wet-etched by buffered fluoric acid to be slimmed to have width of W/2 (FIG. 1D). Consequently, slim silicon oxide films 27 are formed as core materials. The patterns of silicon oxide films 27 are also called sacrificed pattern hereinafter.

The amorphous silicon film 28 is removed by wet etching treatment. An amorphous silicon film 30 having thickness W/2 is formed over the entire surface of the semiconductor substrate 10 as a sidewall material. Etching back of the amorphous silicon film 30 is performed by the RIE method until the silicon oxide films 27 are exposed. Consequently, the amorphous silicon film 30 remains on sidewall sections of the silicon oxide films 27. Amorphous silicon films 30 are formed on the sidewall sections of the slim silicon oxide films 27 as first sidewalls (FIG. 1E).

Regions where the silicon oxide films 27 are desired to be left to correspond to drawing-out sections or the like on the outside of the memory cell array region are covered with resist by the lithography technology. In this state, the silicon oxide films 27 as the core materials are wet-etched and removed by buffered fluoric acid with the resist as a mask (FIG. 1F). Consequently, patterns of the amorphous silicon films 30 having Line/Space=(W/2)/(W/2) are formed. The silicon oxide films 27 as the core materials in the regions covered with the resist remain without being etched.

Figure 2A:
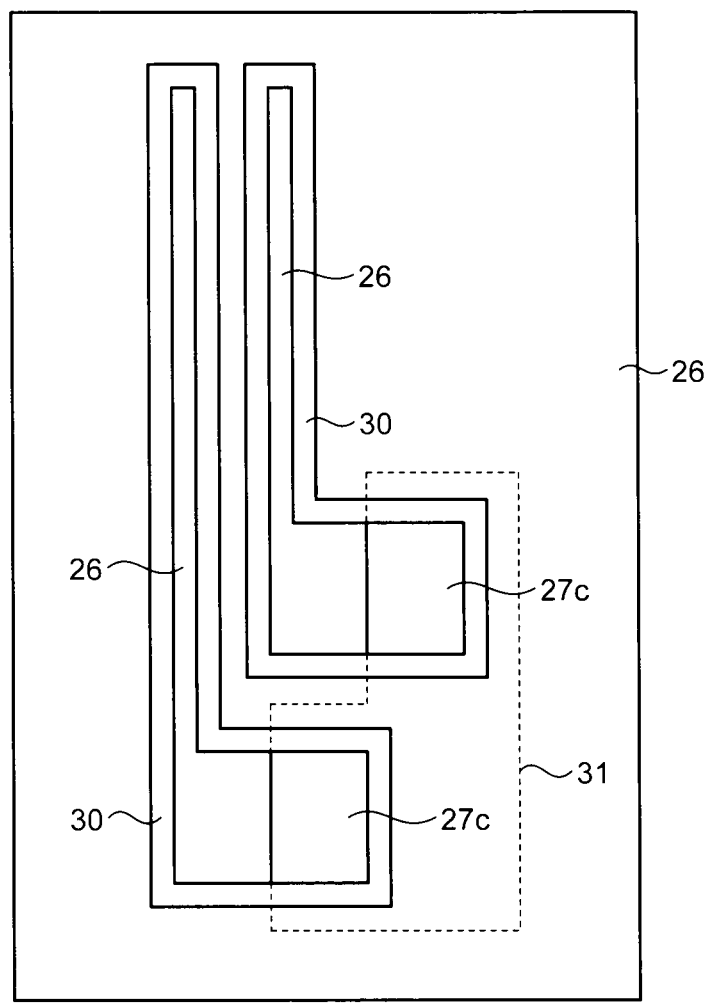

FIG. 2A is a plan view for explaining an example of formation of the patterns of the amorphous silicon films 30 as the first sidewalls. As shown in FIG. 2A, the amorphous silicon films 30 are formed around silicon oxide films 27c as core materials remaining around regions where the slim silicon oxide films 27 as the core materials are removed and in a region 31 covered with the resist. The amorphous silicon films 30 are formed in a closed loop shape.

Figure 1G:
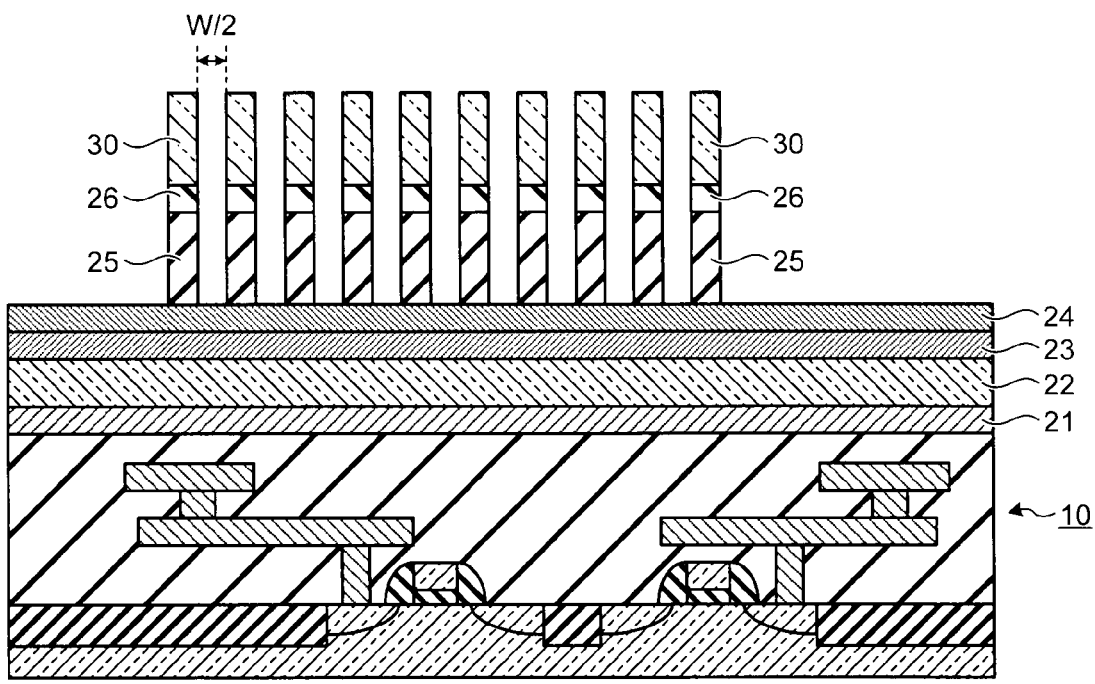

The silicon nitride film 26 and the silicon oxide film 25 of the base are processed by the RIE method with the amorphous silicon films 30, which are the first sidewalls, as masks (FIG. 1G). The patterns of the amorphous silicon films 30 are transferred onto the silicon nitride film 26 and the silicon oxide film 25 by the processing. Silicon nitride films 26 and silicon oxide films 25 remain under the amorphous silicon films 30. The silicon nitride films 26 and the silicon oxide films 25 also remain under the region where the silicon oxide films 27c are left.

The amorphous silicon films 30 and the silicon nitride films 26 are removed by the RIE method. Consequently, as mask materials, only the silicon oxide films 25 remain. The tungsten film 24, the variable resistance layer 23, the polysilicon film 22, and the tungsten film 21 of the base are linearly processed by the RIE method with the silicon oxide films 25 as masks. The layers are processed under gas conditions suitable for materials of the layers.

Figure 1H:
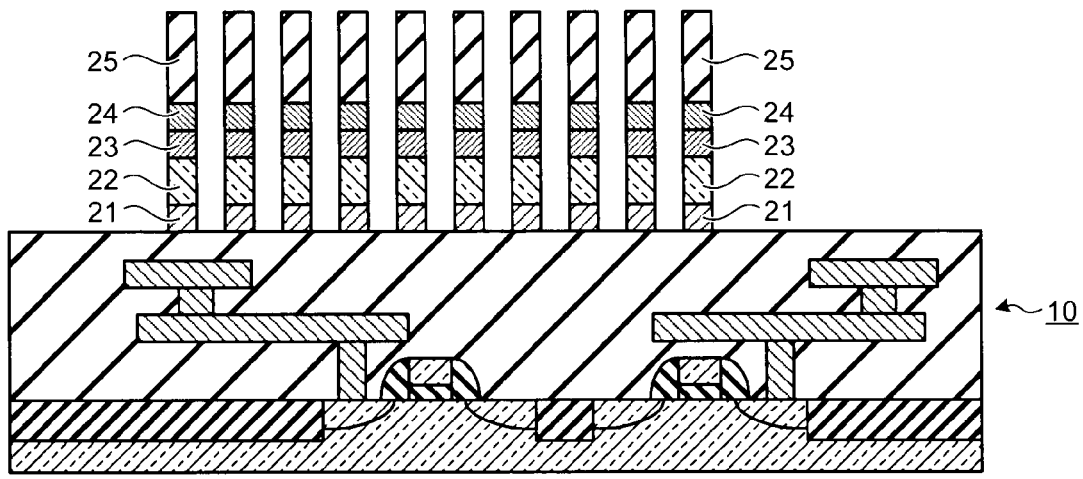

Wires in a first layer (first wiring layers) formed of the tungsten films 21 are formed by the processing. The polysilicon films 22, the variable resistance layers 23, and the tungsten films 24 as CMP stoppers are laminated on the tungsten films 21 in patterns same as the tungsten films 21 (FIG. 1H). In this state, the wires in the first layer (the first wiring layers) formed of the tungsten films 21 are formed in a closed loop shape.

Figure 1I:
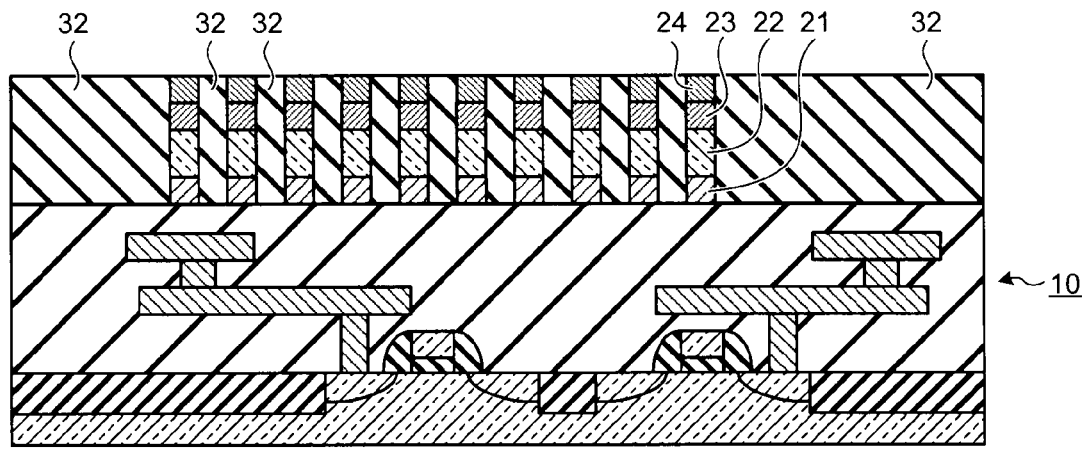

A silicon oxide film 32 as an insulating film is buried in spaces among the patterns by using polysilazane (PSZ). Because an aspect ratio of sections of the spaces among the patterns is large, the use of the PSZ is suitable for burying the silicon oxide film 32. The extra silicon oxide film 32 and the silicon oxide films 25 on the tungsten films 24 are removed by the CMP processing with the tungsten films 24 as stoppers to planarize the surface of the silicon oxide film 32 and the tungsten films 24 (FIG. 1I).

A second element layer is formed. First, a tungsten film 41 to be a second wiring layer (an upper-layer wiring layer) of the cross-point type ReRAM is formed on the semiconductor substrate 10 with the silicon oxide film 32 planarized. Barrier metals are formed as appropriate on and under the tungsten film 41.

Subsequently, a polysilicon film 42 to be second diode as a rectifying element is formed on the tungsten film 41. A P-type polysilicon film, an I-type polysilicon film, and an N-type polysilicon film are laminated in order from a lower layer side (the tungsten film 41 side) or an upper layer side to form the polysilicon film 42.

Figure 1J:
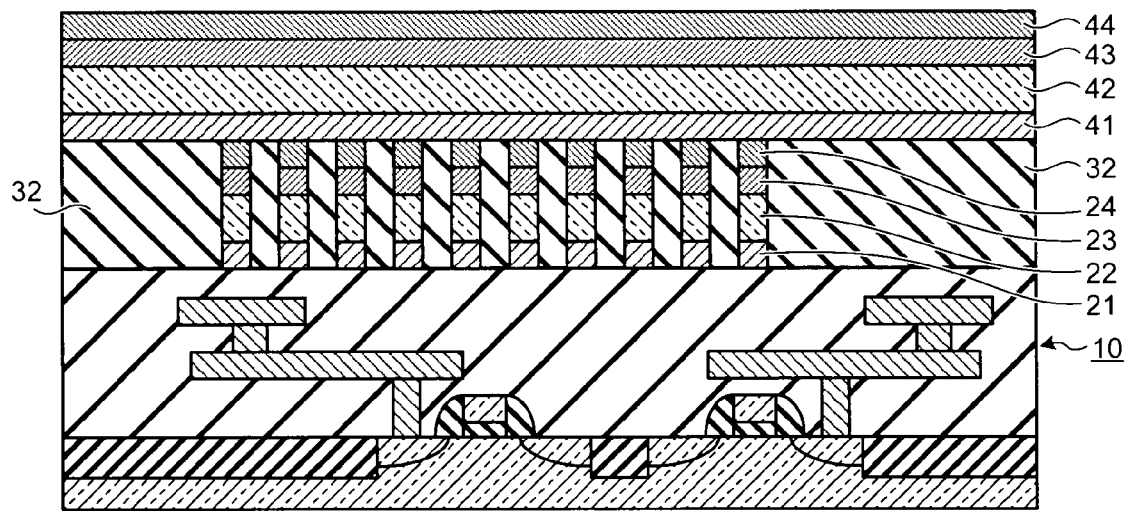

A variable resistance layer 43 to be a second variable resistance element is formed on the polysilicon film 42. Barrier metals are formed as appropriate on and under the variable resistance layer 43. The variable resistance element can also have a configuration in which the variable resistance layer 43 is sandwiched by electrode layers. A tungsten film 44 functioning as a stopper during the CMP processing is formed on the variable resistance layer 43 (FIG. 1J).

In this state, second sidewall transfer processing is performed. The second sidewall transfer processing is performed in the same manner as the processing for the first element layer. A processing method is basically the same as the method for the first element layer. The processing method is different from the method for the first element layer in that a sidewall of a thin pattern having Line/Space=(W/2)/(W/2) (corresponding to the patterns of the amorphous silicon films 30 in the first element layer) is formed to extend in a direction orthogonal to the wires in the first layer (the first wiring layers) formed of the tungsten films 21. Consequently, the first wiring layers of the first element layer and second wiring layers of the second element layer are formed in directions orthogonal to each other in an in-plane direction of the semiconductor substrate 10.

Figure 2B:
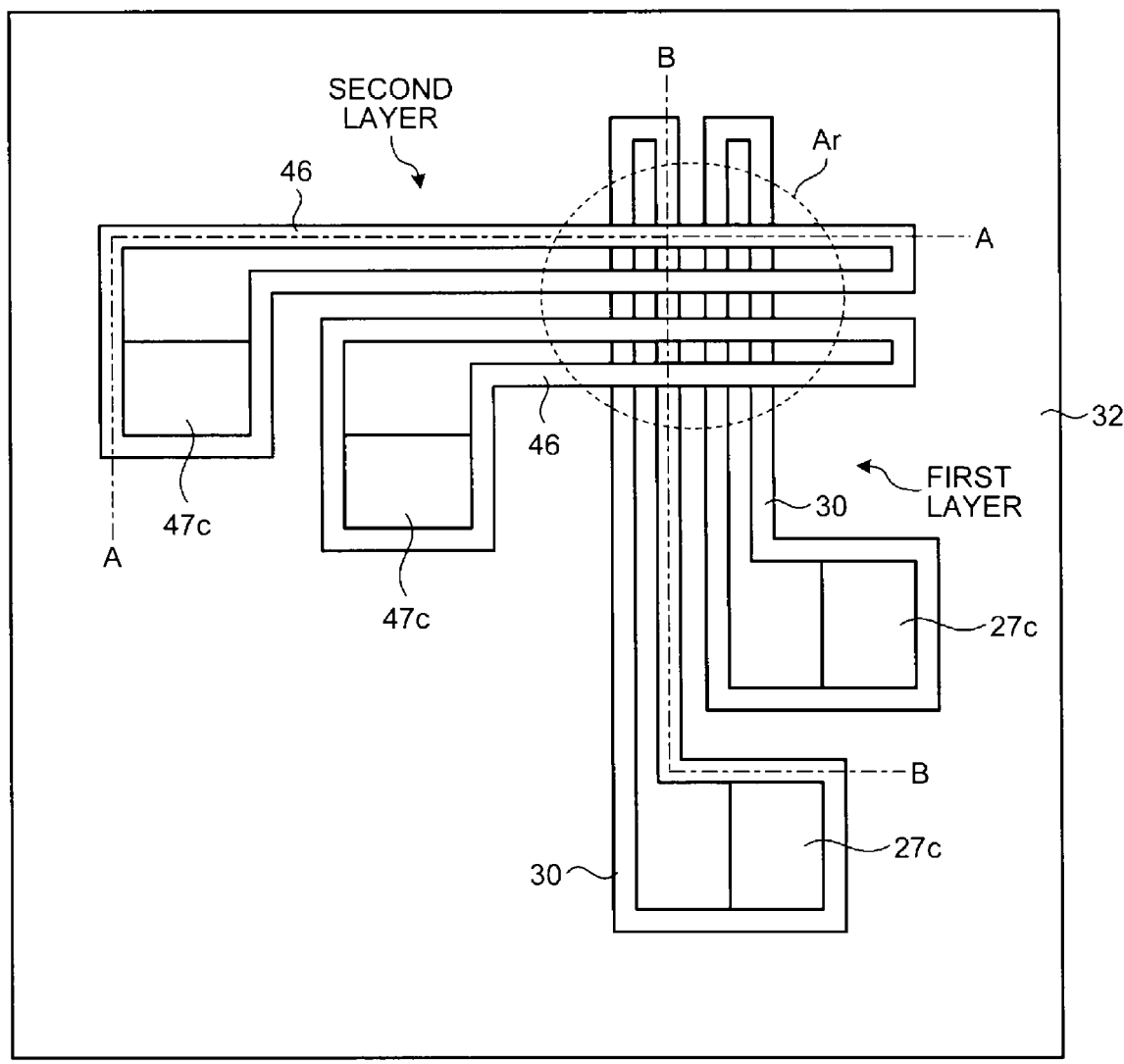

FIG. 2B is a plan view for explaining an example of formation of second sidewalls in the second sidewall transfer processing. In FIG. 2B, patterns of the first sidewalls (the amorphous silicon films 30) in the first sidewall transfer processing and second sidewalls 46 in the second sidewall transfer processing are superimposed and viewed from above. As shown in FIG. 2B, the thin patterns extending in parallel of the first sidewalls (the amorphous silicon films 30) and thin patterns extending in parallel of the second sidewalls 46 are formed in directions orthogonal to each other. The second sidewalls 46 are formed of amorphous silicon films around a region where core materials are removed and around silicon oxide films 47c as core materials and are formed in a closed loop shape. The drawing-out sections from the array (contact sections with drawing-out wires) are partially manufactured in the first wiring layers during the formation of the first layer. Drawing-out sections of the second wiring layers (contact sections with the drawing-out wires) do not have to be arranged on the drawing-out sections.

As in the formation of the first element layer, patterns formed of silicon oxide films obtained by transferring the patterns of the second sidewalls 46 are formed on the tungsten film 44 to be a stopper during the CMP processing. The tungsten film 44, the variable resistance layer 43, the polysilicon film 42, and the tungsten film 41 of the base are processed by the RIE method with the patterns as masks. In this case, after the tungsten film 41 as the wire in the second layer (the second wiring layer) is etched, the tungsten film 24, the variable resistance layer 23, and the polysilicon film 22 in the first layer are processing in the same patterns.

Therefore, in a region (a memory cell array region Ar) where the thin patterns extending in parallel of the first sidewalls (the amorphous silicon films 30) and the thin patterns extending in parallel of the second sidewalls (the amorphous silicon films 46) overlap in the laminating direction, the tungsten film 24, the variable resistance layer 23, and the polysilicon film 22 in the first layer are patterned twice in directions orthogonal to each other in the in-plane direction of the semiconductor substrate 10. In the first element layer, independent diodes and variable resistance elements are formed at intersections of the first wiring layers and the second wiring layers. In other words, a memory cell array having first diodes formed of the polysilicon film 22 and first variable resistance elements formed of the variable resistance layer 23 at the intersections of the first wiring layers and the second wiring layers is formed.

Figure 1K:
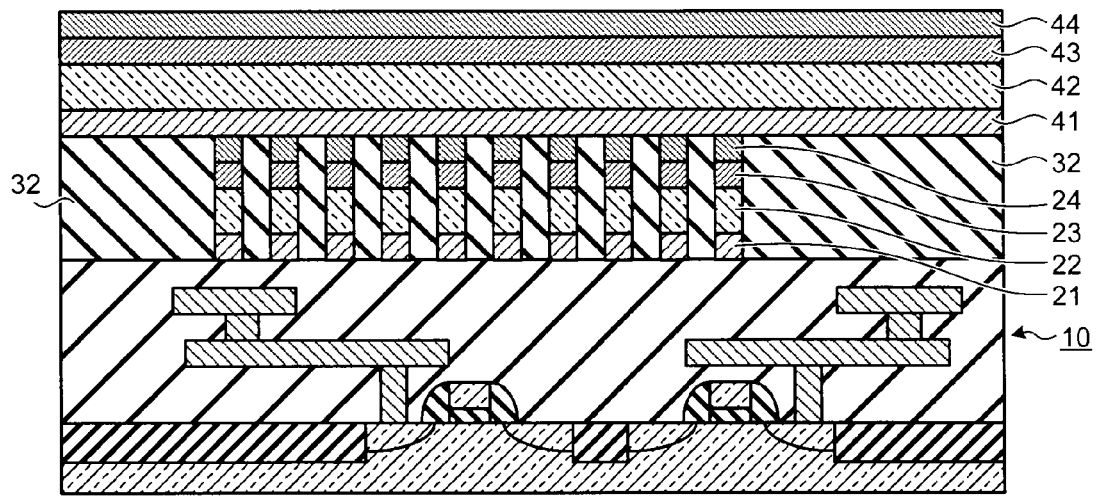
Figure 3A:
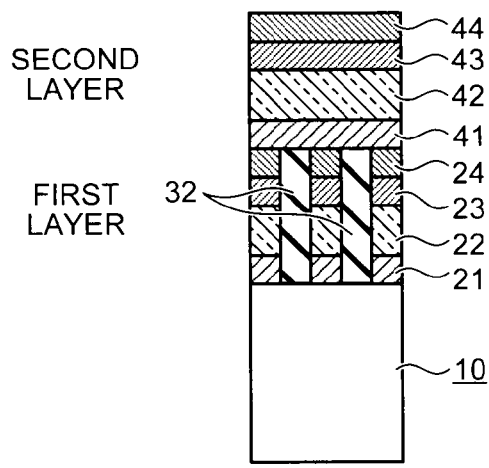
FIGS. 3A to 3D are schematic sectional views for explaining an example of the method of manufacturing a nonvolatile storage device according to the first embodiment.
Figure 3B:
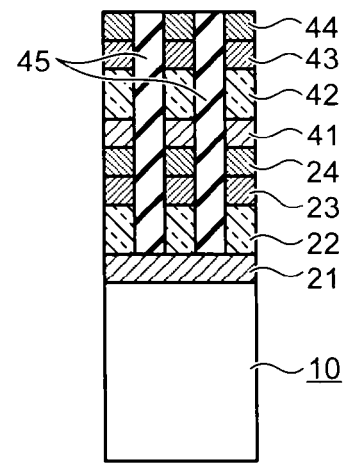

As in the formation of the first element layer, a silicon oxide film 45 as an insulating film is buried in spaces among the patterns by using polysilazane (PSZ). The extra silicon oxide film 45 is removed by the CMP processing using the tungsten film 44 as a stopper to planarize the surface of the silicon oxide film 45 (FIG. 1K). The structure of the memory cell array region Ar in this state is shown in FIGS. 3A and 3B. FIG. 3A is a main part sectional view of the memory cell array region Ar. FIG. 3A is a main part sectional view corresponding to a direction of line A-A shown in FIG. 2B. FIG. 3B is a main part sectional view corresponding to a direction of line B-B shown in FIG. 2B.

A third element layer is formed. First, a tungsten film 51 to be a third wiring layer (an upper-layer wiring layer) of the cross-point type ReRAM is formed on the semiconductor substrate 10 in which the silicon oxide film 45 is planarized. Barrier metals are formed as appropriate on and under the tungsten film 51.

Subsequently, a polysilicon film 52 to be a third diode as a rectifying element is formed on the tungsten film 51. A P-type polysilicon film, an I-type polysilicon film, and an N-type polysilicon film are laminated in order from a lower layer side (the tungsten film 51 side) or an upper layer side to form the polysilicon film 52.

Figure 1L:
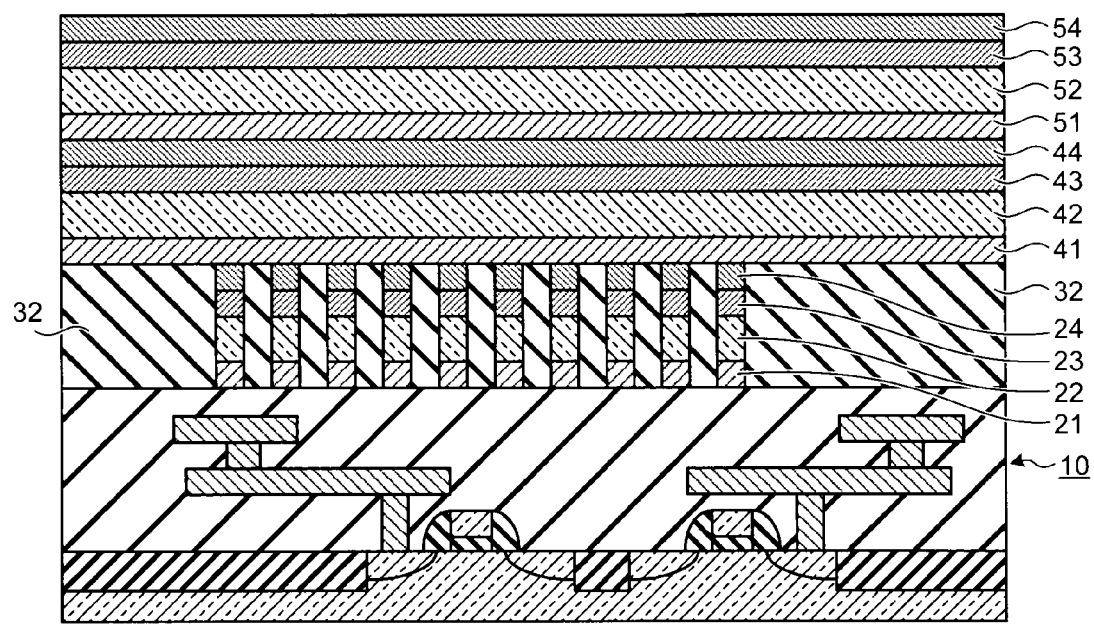

A variable resistance layer 53 to be a third variable resistance element is formed on the polysilicon film 52. Barrier metals are formed as appropriate on and under the variable resistance layer 53. The variable resistance element can also have a configuration in which the variable resistance layer 53 is sandwiched by electrode layers. A tungsten film 54 functioning as a stopper during the CMP processing is formed on the variable resistance layer 53 (FIG. 1L).

In this state, third sidewall transfer processing is performed. The third sidewall transfer processing is performed in the same manner as the processing for the first element layer. A processing method is basically the same as the method for the first element layer. Sidewalls of thin patterns having Line/Space=(W/2)/(W/2) (corresponding to the patterns of the amorphous silicon films 30 in the formation of the first element layer) also extend in a direction substantially parallel to the wires in the first layer (the first wiring layers) formed of the tungsten films 21 and are formed such that the positions of the sidewalls in a horizontal plane are the same in the memory cell array region. Consequently, the first wiring layers of the first element layer and third wiring layers of the third element layer are formed in directions substantially parallel to each other in the in-plane direction of the semiconductor substrate 10. The first wiring layers and the third wiring layers have different height positions but overlap in a laminating direction in the same patterns in the memory cell array region.

FIG. 2C is a plan view for explaining an example of formation of third sidewalls in the third sidewall transfer processing. In FIG. 2C, patterns of the first sidewalls (the amorphous silicon films 30) in the first sidewall transfer processing, the second sidewalls 46 in the second sidewall transfer processing, and third sidewalls 56 in the third sidewall transfer processing are superimposed and viewed from above. As shown in FIG. 2C, the thin patterns extending in parallel of the first sidewalls (the amorphous silicon films 30) and thin patterns extending in parallel of the third sidewalls 56 are formed in the directions substantially parallel to each other in the in-plane direction of the semiconductor substrate 10. The thin patterns have different height positions but most parts of the patterns overlap in the laminating direction. The third sidewalls 56 are formed of amorphous silicon films around a region where core materials are removed and around silicon oxide films 57c as core materials and are formed in a closed loop shape. The drawing-out sections from the array (the contact sections with the drawing-out wires) are partially manufactured in the first wiring layers and second wiring layers during the formation of the first layer and the second layer. Drawing-out sections of the third wiring layers (contact sections with the drawing-out wires) do not have to be arranged on the drawing-out sections.

As in the formation of the first element layer, patterns formed of a silicon oxide film obtained by transferring the patterns of the third sidewalls 56 are formed on the tungsten film 54 to be the stopper during the CMP processing. The tungsten film 54, the variable resistance layer 53, the polysilicon film 52, and the tungsten film 51 of the base are processed by the RIE method with the patterns as masks. However, the processing method is different from the method for the first element layer in that, after the tungsten film 51 as the wires in the third layer (the third wiring layers) are etched, the tungsten film 44, the variable resistance layer 43, and the polysilicon film 42 are processing in the same patterns.

Therefore, in a region (the memory cell array region Ar) where the thin patterns extending in parallel of the second sidewalls (the amorphous silicon films 46) and the thin patterns extending in parallel of the third sidewalls 56 overlap in the laminating direction, the tungsten film 44, the variable resistance layer 43, and the polysilicon film 42 in the second layer are patterned twice in the directions orthogonal to each other in the in-plane direction of the semiconductor substrate 10. In the second element layer, independent diodes and variable resistance elements are formed at intersections of the second wiring layers and the third wiring layers. In other words, a memory cell array having second diodes formed of the polysilicon film 42 and second variable resistance elements formed of the variable resistance layer 43 at the intersections of the second wiring layers and the third wiring layers is formed.

Figure 1M:
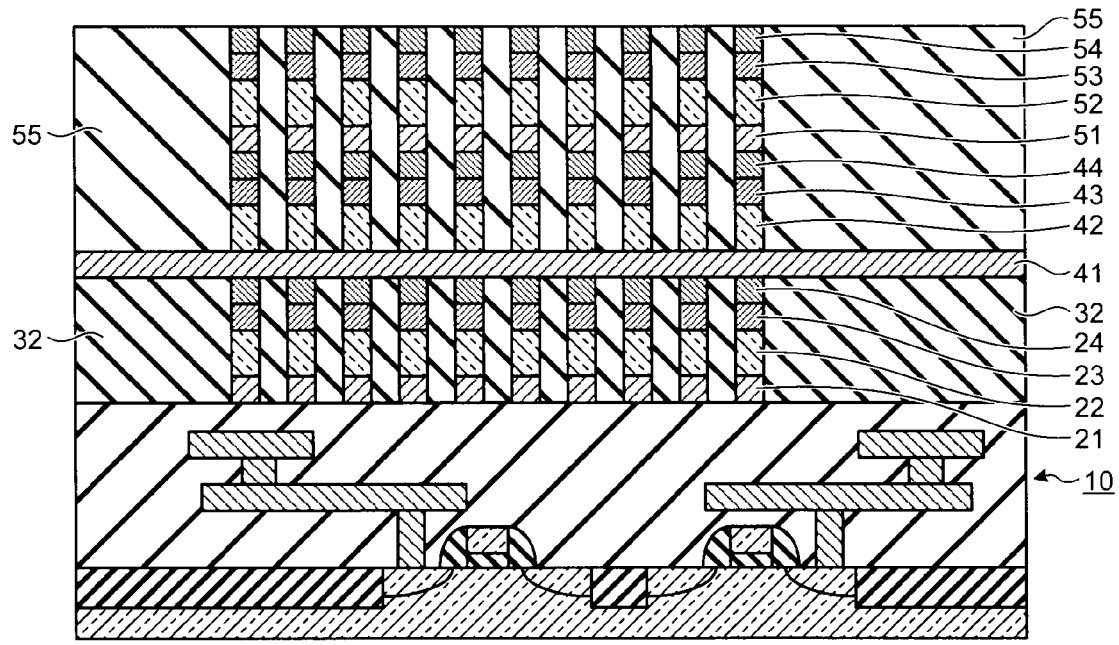
Figure 3C:
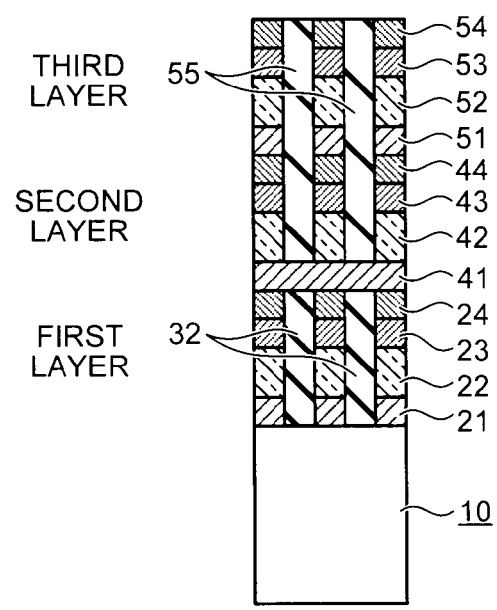
Figure 3D:
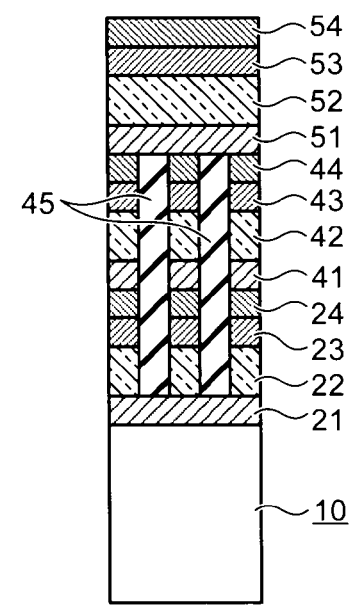

As in the formation of the first element layer, a silicon oxide film 55 as an insulating film is buried in spaces among the patterns by using polysilazane (PSZ). The extra silicon oxide film 55 is removed by the CMP processing using the tungsten film 54 as a stopper to planarize the surface of the silicon oxide film 55 (FIG. 1M). The structure of the memory cell array region Ar in this state is shown in FIGS. 3C and 3D. FIG. 3C is a main part sectional view corresponding to the direction line A-A shown in FIG. 2C. FIG. 3D is a main part sectional view corresponding to the direction of line B-B shown in FIG. 2B.

Subsequently, after the silicon oxide film 55 is buried, connection vias are formed as explained below. The connection vias are contacts that collectively connect wires for a plurality of layers. The connection vias are connected to a desired wiring layer and caused to reach the wire 12 in the transistor layer of the semiconductor substrate 10.

Figure 1N:
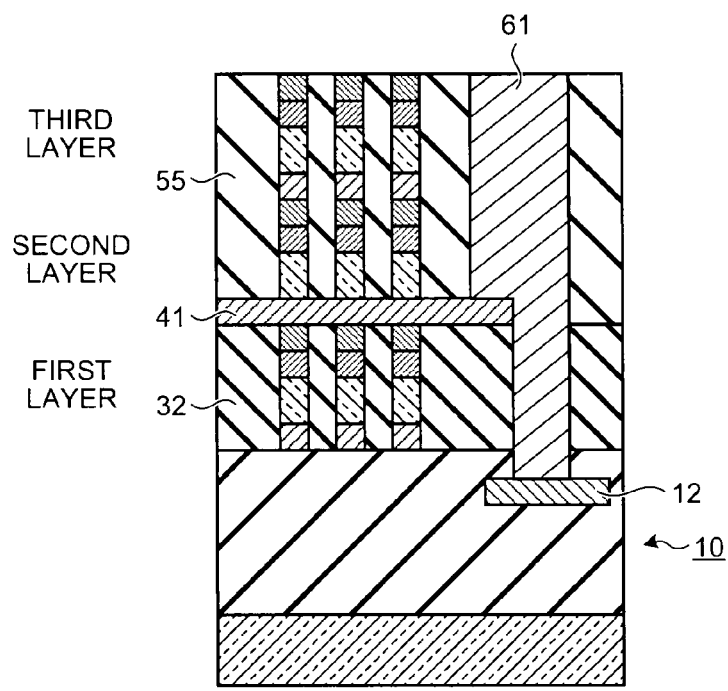
Figure 1O:
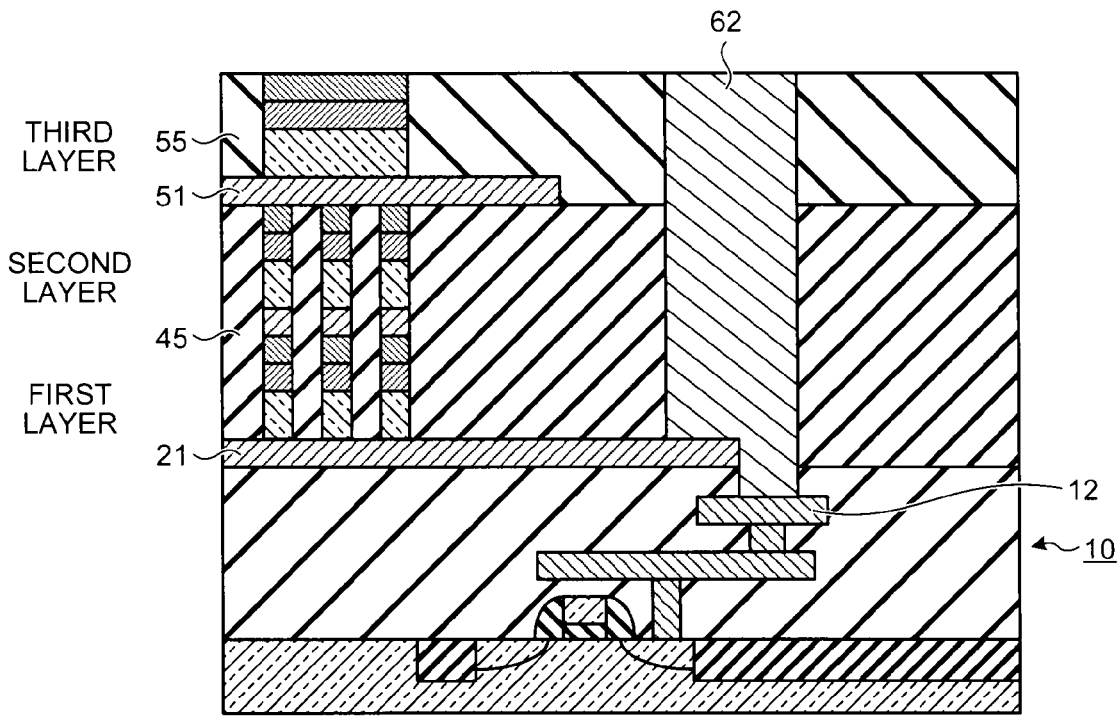

FIGS. 1N and 1O are sectional views for explaining formation of the connection vias. FIG. 1N is a main part sectional view corresponding to the direction of line A-A shown in FIG. 2C. FIG. 1O is a main part sectional view corresponding to the direction of line B-B shown in FIG. 2C. As shown in FIG. 1N, a connection via 61 is a connection via connected from the surface of the silicon oxide film 55 to the tungsten film 41 as the second wiring layer and reaching the wire 12 in the transistor layer of the semiconductor substrate 10. As shown in FIG. 1O, a connection via 62 is a connection via connected from the surface of the silicon oxide film 55 to the tungsten film 21 and reaching the wire 12 in the transistor layer of the semiconductor substrate 10.

The connection via is formed by, after forming a via hole in a desired position by the lithography technology and the etching technology, filling the via hole with a conductive material. The via hole is formed in, in the in-plane direction, a position connected to both of a desired wire and the wire 12 in the transistor layer of the semiconductor substrate 10. As the filling material for the connection via, for example, tungsten is used. Extra tungsten is removed by the CMP processing.

Subsequently, closed-loop cut (cutting) for the wiring layers of the respective layers is carried out. Because the wiring layers of the respective layers are formed by the sidewall transfer process, the wiring layers are formed in a closed-loop shape. To make the wires in the memory cell array region electrically independent one by one, the wiring layers formed in the closed-loop shape need to be closed-loop cut in a predetermined cutting region. In this embodiment, the closed-loop cut is collectively performed in one processing in a plurality of element layers rather than being performed for each of the wiring layers of the respective layers. Specifically, after wires having the closed-loop shape are formed in the element layers by the sidewall transfer process, a hole piercing through from an upper layer to a lower layer is formed by dry etching, whereby the closed-loop cut for the wiring layers formed in the element layers is collectively performed by one processing.

Figure 1P:
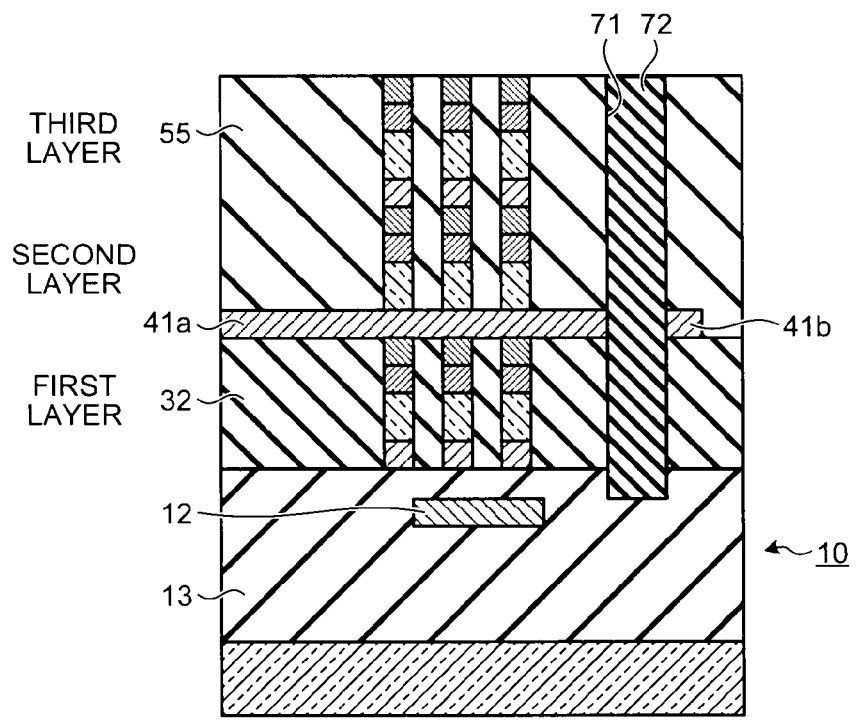
Figure 1Q:
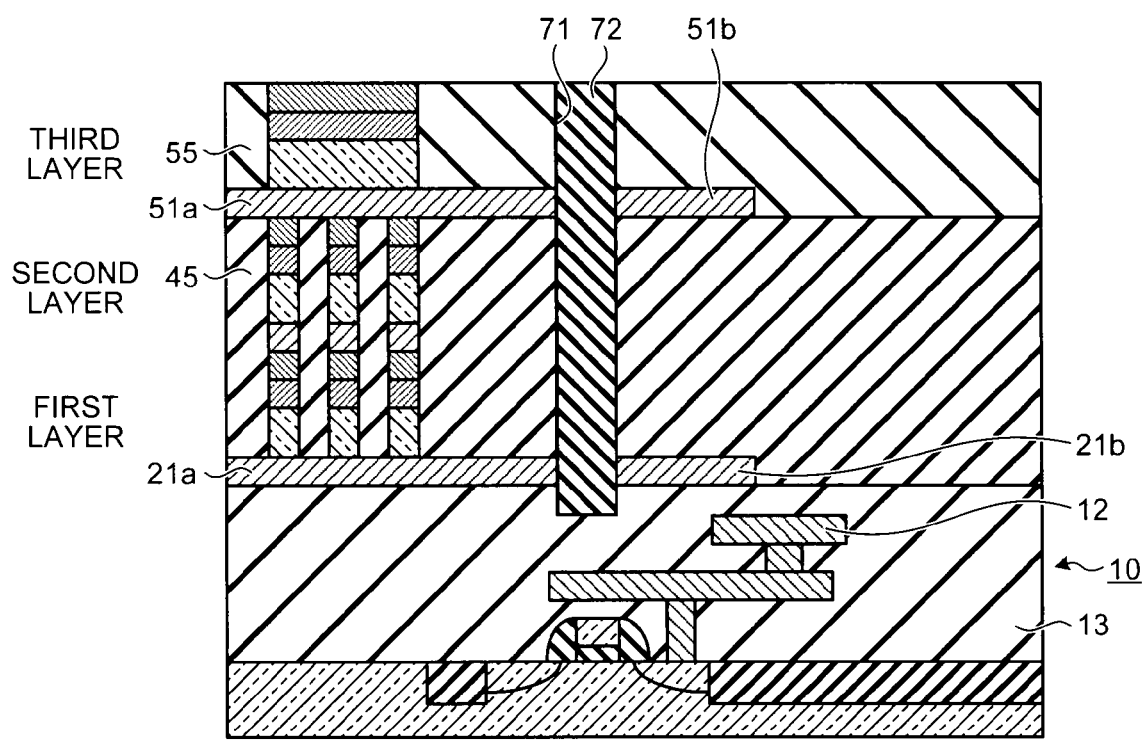

Specifically, as shown in FIGS. 1P and 1Q, a plurality of closed-loop cut holes 71 reaching from the surface of the silicon oxide film 55 to the insulating layer 13 in the transistor layer of the semiconductor substrate 10 are formed by using the RIE method in the same manner as the formation of the connection vias. The closed-loop cut holes 71 are filled with an insulating material 72. FIGS. 1P and 1Q are sectional views for explaining an example of the closed-loop cut. FIG. 1P is a main part sectional view corresponding to the direction of line A-A shown in FIG. 2C. FIG. 1Q is a main part sectional view corresponding to the direction of line B-B shown in FIG. 2C. These figures are figures for explaining that the wiring layers are cut by performing the closed-loop cut. A cutting position of the wiring layers is not the same as a cutting position in an example shown in FIG. 4 explained later.

As shown in FIG. 1P, the tungsten film 41 as the second wiring layer is electrically divided into a tungsten film 41a and a tungsten film 41b when the closed-loop cut hole 71 is formed and the inside of the closed-loop cut hole 71 is filled with the insulating material 72. As shown in FIG. 1P, the tungsten film 21 as the first wiring layer and the tungsten film 51 as the third wiring layer are respectively electrically divided into tungsten films 21a and 21b and tungsten films 51a and 51b when the closed-loop cut hole 71 is formed and the inside of the closed-loop cut hole 71 is filled with the insulating material 72. The closed-loop cut hole 71 only has to have depth enough for piercing through a plurality of wiring layers located in a lower portion of a forming place of the closed-loop cut hole 71 and closed-loop cutting the wiring layers. The closed-loop cut hole 71 is set to at least depth reaching a lower layer of the first wiring layer as the wiring layer of the lower layer. Because the closed-loop cut hole 71 has a large aspect ratio, it is advisable to fill the closed-loop cut hole 71 with PSZ.

Figure 4:
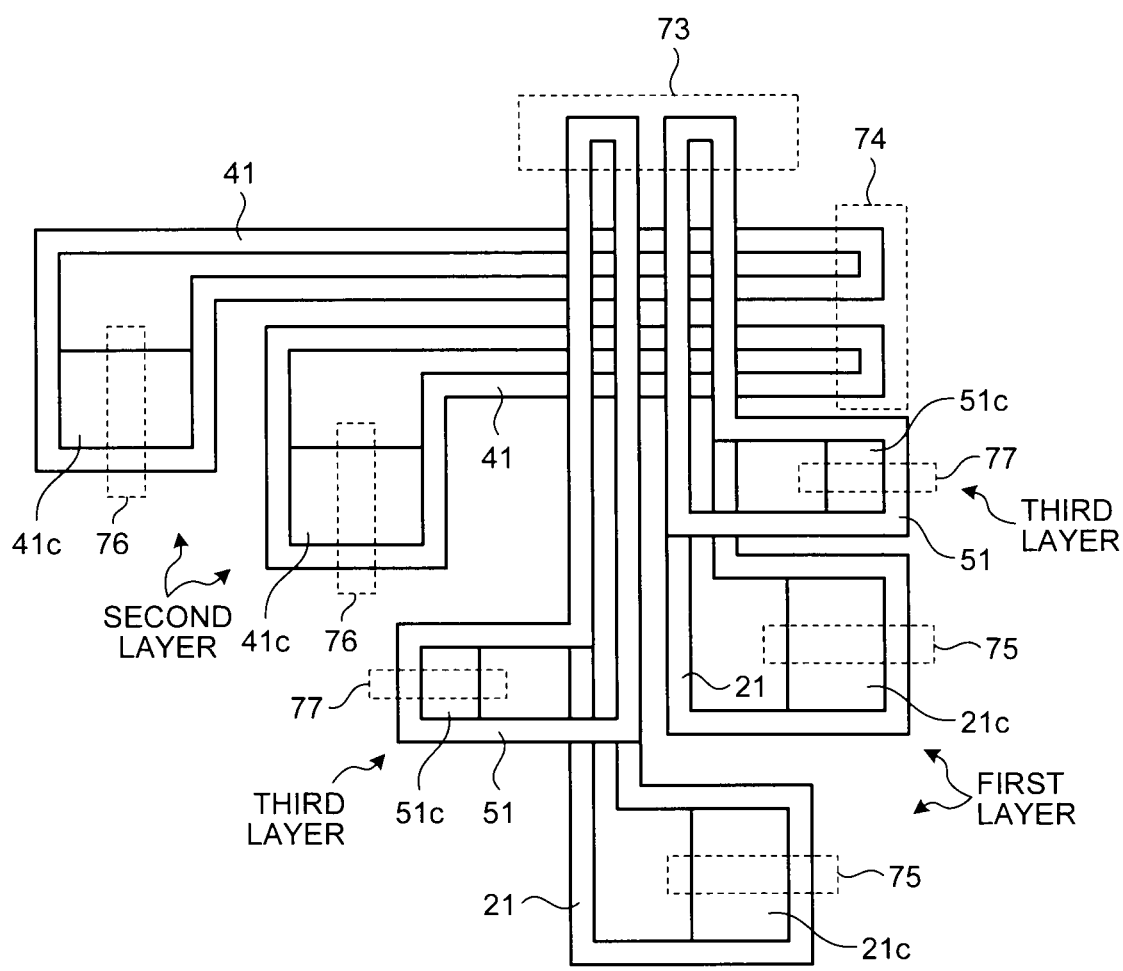
FIG. 4 is a schematic plan view for explaining an example of the method of manufacturing a nonvolatile storage device according to the first embodiment.

The forming place (a cutting place) of the closed-loop cut hole 71 is explained. FIG. 4 is a schematic diagram for explaining a cutting region for the closed-loop cut. In the figure, the patterns of the first wiring layer, the second wiring layer, and the third wiring layer are superimposed. When the connection vias are formed, holes are partially superimposed in the wiring layers in the laminating direction to form via holes under a condition for not cutting the wiring layers. However, in the closed-loop cut, to cut the wiring layers having the closed-loop shape and make the wiring layers electrically independent one by one, the closed-loop cut hole 71 is formed to actively cut the wiring layers.

In the case of the example shown in FIG. 4, on the outside of the memory cell array region Ar, cut regions are an end region 73 where a folded end of the thin patterns extending in parallel in the tungsten film 21 as the first wiring layer (one end in a longitudinal direction of the first wiring layer) and a folded end of the thin patterns extending in parallel in the tungsten film 51 as the third wiring layer (one end in a longitudinal direction of the third wiring layer) overlap in the laminating direction, an end region 74 where the thin patterns extending in parallel in the tungsten film 41 as the second wiring layer are folded, a center region 75 in the in-plane direction of the semiconductor substrate 10 in a contact section 21c provided to be connected to the tungsten film 21 as the first wiring layer, a center region 76 in the in-plane direction of the semiconductor substrate 10 in a contact section 41c provided to be connected to the tungsten film 41 as the second wiring layer, and a center region 77 in the in-plane direction of the semiconductor substrate 10 in a contact section 51c provided to be connected to the tungsten film 51 as the third wiring layer.

In this way, in the example shown in FIG. 4, the first wiring layer (the lower wiring layer) and the third wiring layer (the upper wiring layer) among the three wiring layers are formed to overlap each other in the laminating direction at one end in the longitudinal direction of the wiring layers. One end in the longitudinal direction of the wiring layers is formed as a cut region and the closed-loop cut hole 71 is formed, whereby both the first wiring layer and the third wiring layer are cut. In this example, the wiring layers of the two layers are formed to overlap each other at one end in the longitudinal direction. However, the wiring layers of three or more layers can also be formed to overlap one another. The first wiring layer and the third wiring layer among the wiring layers of the three layers can also be formed not to overlap each other in the laminating direction at the other end in the longitudinal direction of the wiring layers. The closed-loop cut hole 71 for dividing the contact section 21c is formed, whereby the other end of the first wiring layer is formed as a contact section with a drawing-out wire in an independent wiring layer after the closed-loop cut. Separately from the closed-loop cut hole 71, the closed-loop cut hole 71 for dividing the contact sections 41c and 51c is processed, whereby contact sections with drawing-out wires in independent wiring layers after the closed-loop cut are also formed for the second and third wiring layers.

The closed-loop cut holes 71 reaching from the surface of the silicon oxide film 55 to the insulating layer 13 in the transistor layer of the semiconductor substrate 10 are simultaneously formed in the cut regions by the RIE method, whereby the closed-loop cut for the first wiring layer, the second wiring layer, and the third wiring layer is collectively performed in one processing. The closed-loop cut holes 71 are filled with the insulating material.

In this way, the wiring layers of the three layers having the closed-loop shape formed by the sidewall transfer process and three-dimensionally laminated via the memory cell are collectively cut in the same process (the closed-loop cut). Consequently, the closed-loop cut processing required to be performed three times in the past is performed once. Therefore, it is possible to reduce the number of steps and the number of used mask layers required for the closed-loop cut for the wiring layers and reduce cost.

The folded end of the thin patterns in the tungsten film 21 as the first wiring layer and the folded end of the thin patterns in the tungsten film 51 as the third wiring layer are formed to overlap in the laminating direction. This makes it possible to perform the closed-loop cut for both the first wiring layer and the third wiring layer by forming the closed-loop cut hole 71 in one cut place (the end region 73). In other words, it is desirable to take into account arrangement of wires in advance to form the closed-loop cut hole 71 in the same region in the wiring layers. This makes it possible to reduce the number of formed closed-loop cut holes 71. This is not limited to when the positions of the folded end of the thin patterns in the tungsten film 21 as the first wiring layer and the folded end of the thin patterns in the tungsten film 51 as the third wiring layer are formed to overlap in the laminating direction completely coincide with each other. Even if the positions of the ends lightly deviate from each other, the layers can be collectively cut (the closed-loop cut) in the same manner as long as both the ends are arranged to be set within one cut region (opening) when viewed from above.

Subsequently, the extra insulating material filling the closed-loop cut holes 71 is removed by the CMP processing to expose the connection vias 61 and 62 and the tungsten film 54 in the upper part of the element layer. A fourth element layer and a fifth element layer are formed by repeating the same process. After the formation of the fifth element layer, formation of connection vias and closed-loop cut for the second time are performed in the same manner. The formation of element layers, the formation of connection vias, and the closed-loop cut are repeated, whereby it is possible to obtain a nonvolatile storage device having structure in which columnar memory cells are held between upper and lower wiring layers and the memory cells are laminated three-dimensionally.

When an element layer of a top layer is formed, for example, in FIGS. 3C and 3D, the silicon oxide film 55 is buried and, after the silicon oxide film 55 is removed and the surface is planarized by the CMP processing, a tungsten film is formed. A laminated film from the tungsten film to the polysilicon film 52 as the third diode is collectively linearly processing in an extending direction of the tungsten film 41 as the second wiring layer. The interlayer insulating film is buried among processed laminated bodes and subjected to the CMP processing with the tungsten film in the top layer as a stopper film, whereby a wiring layer of the top layer (a fourth wiring layer) is formed. Consequently, a nonvolatile storage device in which columnar memory cells are held between the upper and lower wiring layers is obtained.

According to the first embodiment, the wiring layers of a plurality of layers having the closed-loop shape formed by the sidewall transfer process and three-dimensionally laminated via the memory cells are collectively cut in the same process (closed-loop cut). Therefore, there is an effect that it is possible to reduce the number of steps and the number of used mask layers required for the closed-loop cut for the wiring layers and reduce cost.

In the above explanation, the actual substance names are referred to and the embodiment is specifically explained. However, types of insulating films, conductive members, and the like including not only those directly included in an electronic component but also a core material, a sidewall material, and a mask material in the sidewall transfer processing are not limited to the materials explained above and can be changed as appropriate. The number of layers for which the closed-loop cut is simultaneously processed is not limited to three and can be an arbitrary number. The order of the formation of connection vias and the closed-loop cut is not specifically limited. For example, in a predetermined laminated state in which an arbitrary number of layers are connected, it is also possible that, first, the processing of the closed-loop cut is performed and, then, the formation of connection vias is performed.

In a second embodiment, a rectifying element and a variable resistance element are etched in a step different from a step of etching a wiring layer to manufacture a nonvolatile storage device. FIGS. 5A to 5L are schematic sectional views for explaining an example of a procedure of a method of manufacturing a nonvolatile storage device according to the second embodiment.

Figure 5A:
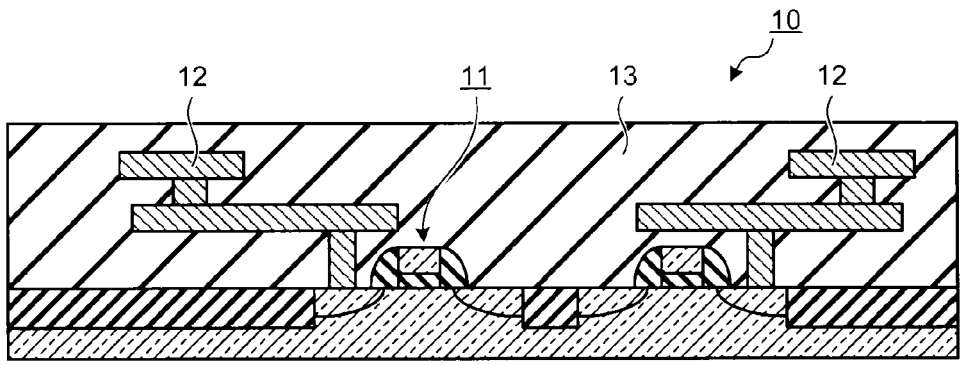
FIGS. 5A to 5L are schematic sectional views for explaining an example of the method of manufacturing a nonvolatile storage device according to the first embodiment.

First, as in the first embodiment, the semiconductor substrate 10 on which the transistor elements 11 and the wires 12 are formed by the publicly-known method is prepared as a base layer. In the semiconductor substrate 10, as shown in FIG. 5A, the transistor elements 11 on a semiconductor wafer and the wires 12 connected to the transistor elements 11 are buried by a silicon oxide film serving as the insulating layer 13. The surface of the semiconductor substrate 10 is planarized by the CMP processing.

Subsequently, a first element layer is formed. First, a tungsten film 121 is formed by a film forming method such as the sputtering method or the CVD method. The tungsten film 121 is processed by using a sidewall transfer process same as the process explained with reference to FIGS. 1C to 1H in the first embodiment. Wires in a first layer (first wiring layers) formed of tungsten films 121 having line and space patterns are formed on the semiconductor substrate 10 by the processing. In this state, the wires in the first layer (the first wiring layers) formed of the tungsten films 121 are formed in a closed loop shape. The tungsten film 121 is processed by the RIE method. However, the damascene method can also be used according to necessity.

Figure 5B:
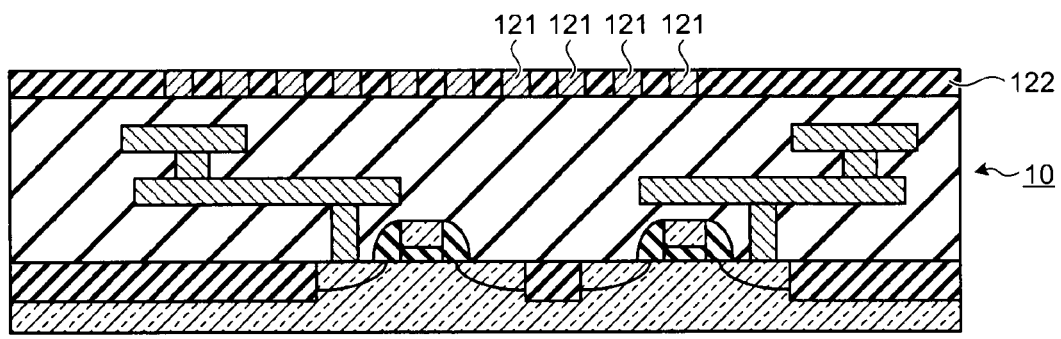

Subsequently, a silicon oxide film 122 as an insulating film is buried in spaces among the patterns by using polysilazane (PSZ). The extra silicon oxide film 122 is removed by the CMP processing to planarize the surface with the tungsten films 121 as a stopper (FIG. 5B).

A polysilicon film 123 to be a first diode as a rectifying element is formed on the semiconductor substrate 10 by a film forming method such as the CVD method. The polysilicon film 123 can be caused to operate as a diode by laminating a P-type polysilicon film, an I-type polysilicon film, and an N-type polysilicon film are laminated in order from a lower layer side (the tungsten film 121 side) or an upper layer side.

A variable resistance layer 124 to be a first variable resistance element is formed on the polysilicon layer 123 by a film forming method such as the sputtering method. Not-shown barrier metals are formed as appropriate on and under the variable resistance layer 124 according to necessity. The variable resistance element can also have a configuration in which the variable resistance layer 124 is sandwiched by electrode layers. A tungsten film 125 is formed on the variable resistance layer 124 by a film forming method such as the sputtering method or the CVD method. The tungsten film 125 functions as a stopper during the CMP processing in a later step.

For example, a silicon oxide film 127 is formed on the tungsten film 125 as a hard mask film by using the CVD method. The silicon oxide film 127 functions as a mask during etching processing in formation of a variable resistance element and a rectifying element later. Columnar resist patterns are formed on the silicon oxide film 127 by the publicly-known lithography technology. The resist patterns are formed as patterns of a memory cell array at predetermined intervals in an extending direction of the wires in the first layer (the first wiring layers) such that the resist patterns are located on the wires in the first layer (the first wiring layers).

Figure 5C:
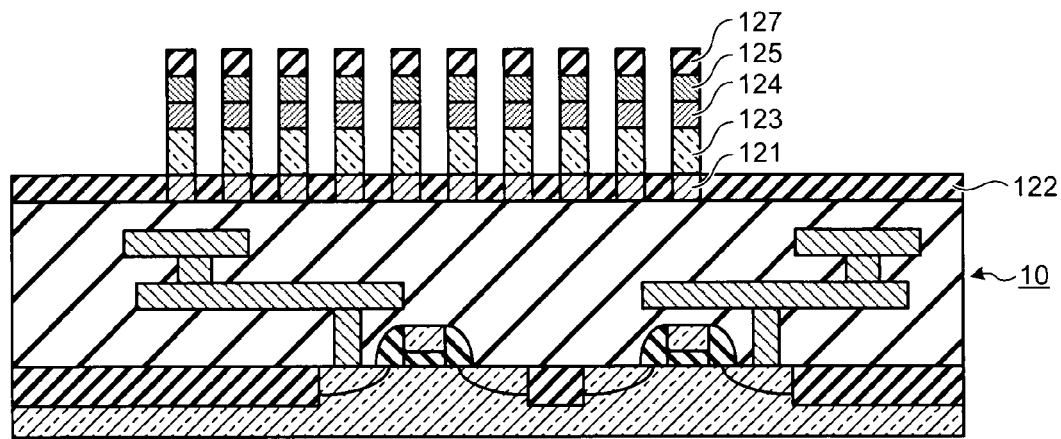

Thereafter, the silicon oxide film 127 is processed by the RIE method with the resist patterns as masks to transfer the patterns of the memory cell array onto the silicon oxide film 127. The resist patterns are removed and the tungsten film 125, the variable resistance layer 124, and the polysilicon film 123 are processing in a columnar shape with the silicon oxide film 127 as a mask to form columnar structure sections (FIG. 5C). The respective layers are processed under gas conditions suitable for materials of the layers. Consequently, memory cells in the first layer in which first diodes and variable resistance layers are laminated at predetermined intervals are formed on the first wiring layers (tungsten films 121). At this point, a half pitch of the memory cell array is, for example, a minimum processing dimension of lithography.

Figure 5D:
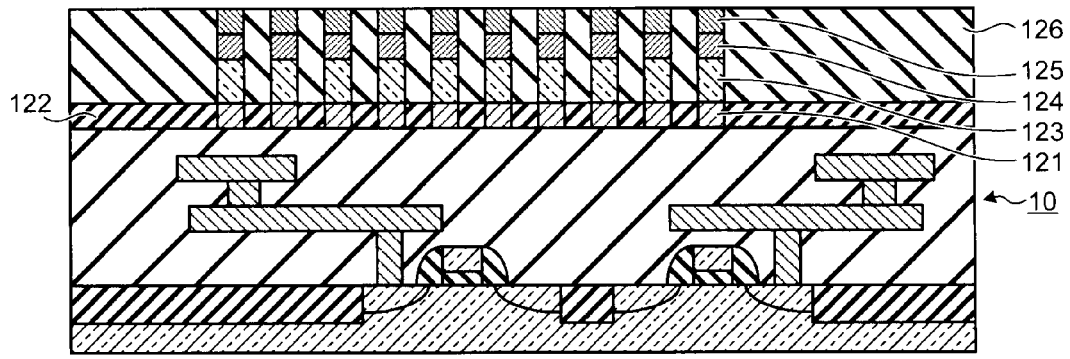

A silicon oxide film 126 is formed as an interlayer insulating film by using polysilazane (PSZ) to fill spaces among the memory cells processed in the columnar shape and to be formed thicker than the upper surfaces of the tungsten films 125. Thereafter, the extra silicon oxide film 126 and the silicon oxide films 127 as masks are removed by the CMP method with the tungsten films 125 as stoppers to planarize the surface of the silicon oxide film 126 (FIG. 5D).

A second element layer is formed. A tungsten film 131 is formed on the tungsten films 125 and the silicon oxide film 126. Wires in a second layer (second wiring layers) formed of the tungsten film 131 having line and space patterns are formed by using the sidewall transfer process in the same manner as the wires in the first layer (the first wiring layers). At this point, in a forming region of the memory cell array, the wires in the second layer (the second wiring layers) are formed in directions in which the line and space patterns of the wires in the first layer (the first wiring layers) and the wires in the second layer (the second wiring layers) are orthogonal to each other in the in-plane direction of the semiconductor substrate 10. In this state, the second wires in the second layer (the second wiring layers) formed of the tungsten film 131 are formed in a closed-loop shape.

Figure 5E:
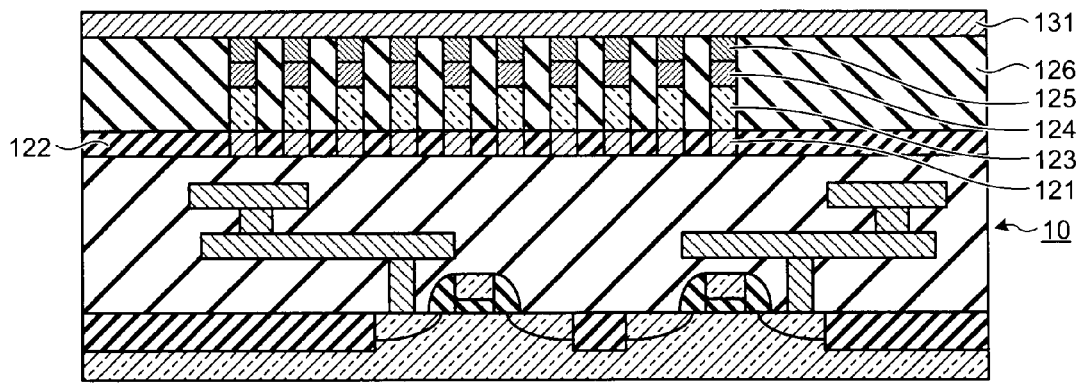

A silicon oxide film as an insulating film is buried in spaces among the patterns by using polysilazane (PSZ). The extra silicon oxide film is removed by the CMP processing with the tungsten film 131 as a stopper to planarize the surface of the silicon oxide film (FIG. 5E).

Figure 5F:
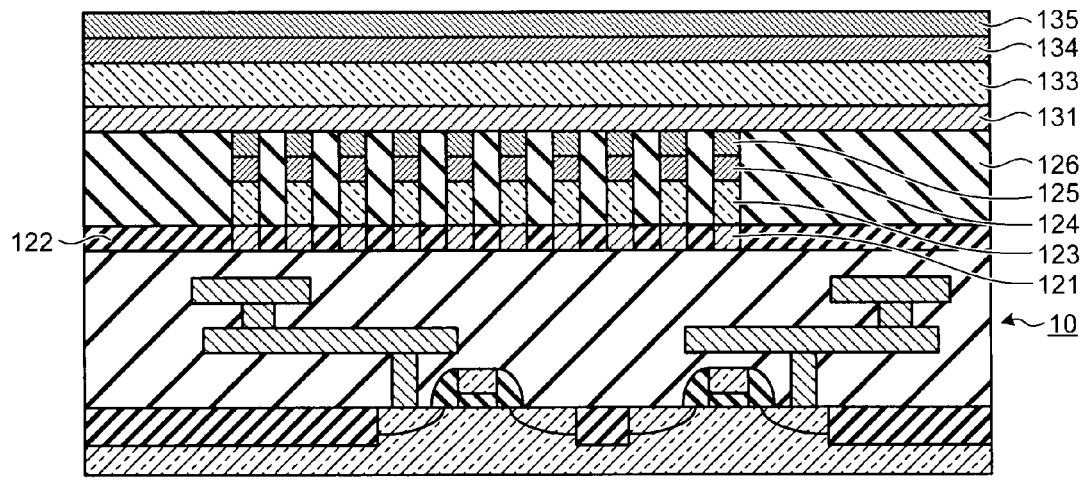
Figure 5G:
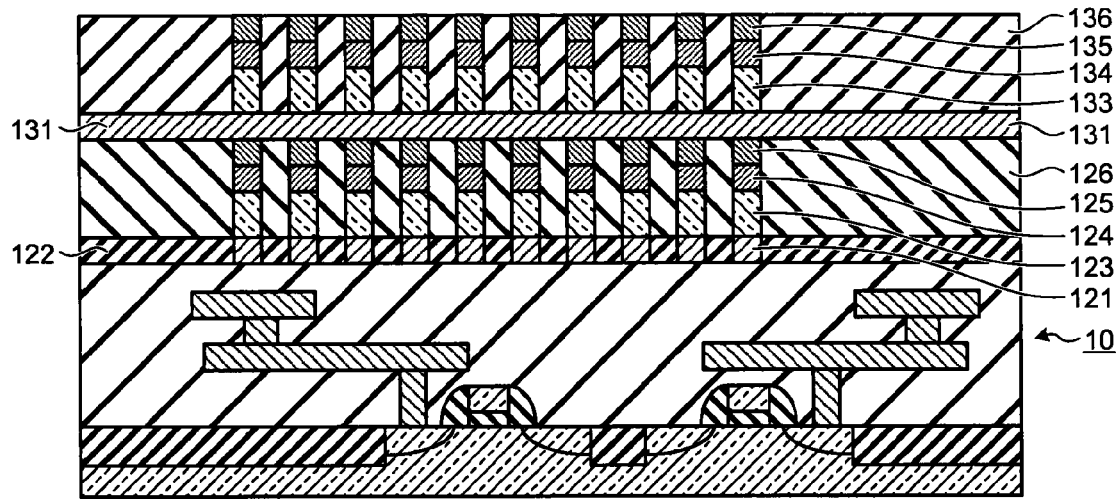

A polysilicon film 133 to be a second diode as a rectifying element, a variable resistance layer 134 to be a second variable resistance element, and a tungsten film 135 functioning as a stopper during the CMP processing are sequentially formed on the semiconductor substrate 10 (FIG. 5F). These layers are processed in a columnar shape in the same manner as the first layer. Consequently, memory cells in the second layer in which second diodes and variable resistance layers are laminated at predetermined intervals are formed on the second wiring layers (the tungsten film 131). Thereafter, as in the first layer, the spaces among the memory cells processed in the columnar shape are filled with a silicon oxide film 136 by using polysilazane (PSZ) and the extra silicon oxide film 136 is removed to planarize the surface of the silicon oxide film 136 (FIG. 5G).

A third element layer is formed. Tungsten films 141 are formed on the tungsten films 135 and the silicon oxide film 136. In the same manner as the wires in the first layer (the first wiring layers), wires in a third layer (third wiring layers) formed of the tungsten films 141 having line and space patterns are formed by using the sidewall transfer process. At this point, in the forming region of the memory cell array, the wires in the third layer (the third wiring layers) are formed in a direction same as the directions of the line and space patterns of the wires in the first layer (the first wiring layers) in the in-plane direction of the semiconductor substrate 10. In this state, the wires in the third layer (the third wiring layers) formed of the tungsten films 141 are formed in a closed-loop shape.

A silicon oxide film 142 as an insulating film is buried in spaces among patterns by using polysilazane (PSZ). The extra silicon oxide film 142 is removed by the CMP processing with the tungsten films 141 as stoppers to planarize the surface of the silicon oxide film 142.

Figure 5H:
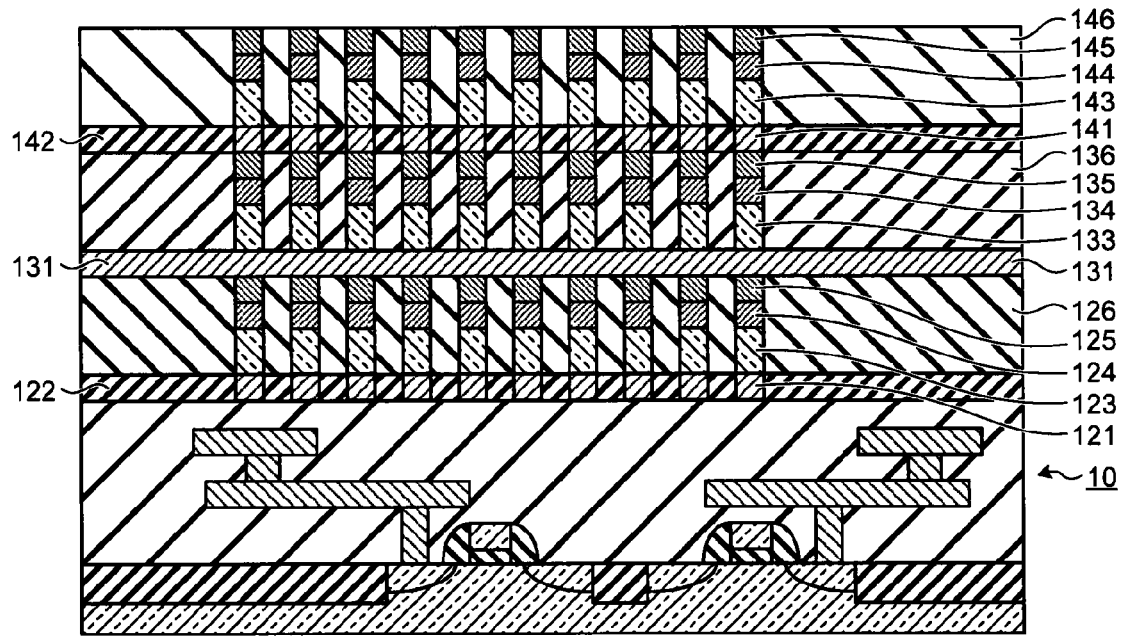
Figure 6:
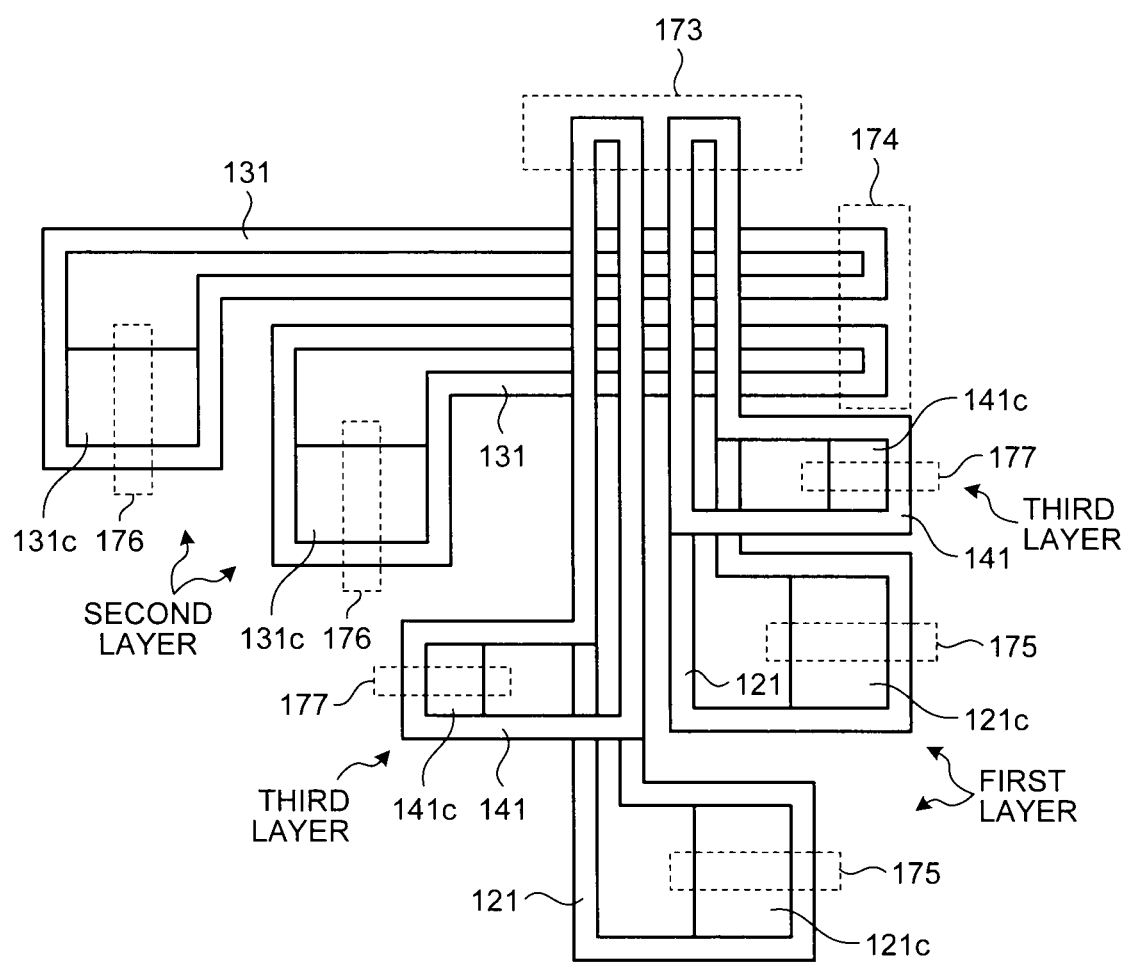
FIG. 6 is a schematic plan view for explaining an example of a method of manufacturing a nonvolatile storage device according to a second embodiment.

A polysilicon film 143 to be a third diode as a rectifying element, a variable resistance layer 144 to be a third variable resistance element, and a tungsten film 145 functioning as a stopper during the CMP processing are sequentially formed on the semiconductor substrate 10. These layers are processed in a columnar shape in the same manner as the first layer. Consequently, memory cells in the third layer in which third diodes and variable resistance layers are laminated at predetermined intervals are formed on the third wiring layers (the tungsten films 141). Thereafter, as in the first layer, the spaces among the memory cells processed in the columnar shape are filled with a silicon oxide film 146 by using polysilazane (PSZ) and the extra silicon oxide film 146 is removed to planarize the surface of the silicon oxide film 146 (FIG. 5H). FIG. 6 is a schematic diagram of positions of the wiring layers after the formation of the memory cells in the third layer. The patterns of the first wiring layer, the second wiring layer, and the third wiring layer are shown in a superimposed state.

After the silicon oxide film 146 is buried, connection vias are formed in the same manner as the first embodiment. The connection vias are connected to a desired wiring layer and caused to reach the wires 12 in the transistor layer of the semiconductor substrate 10.

Figure 5I:
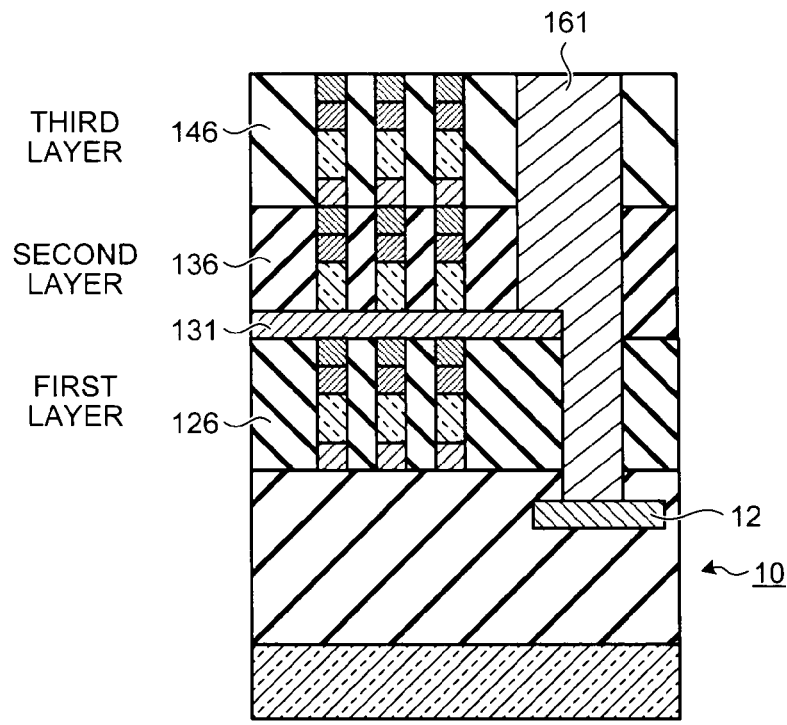
Figure 5J:
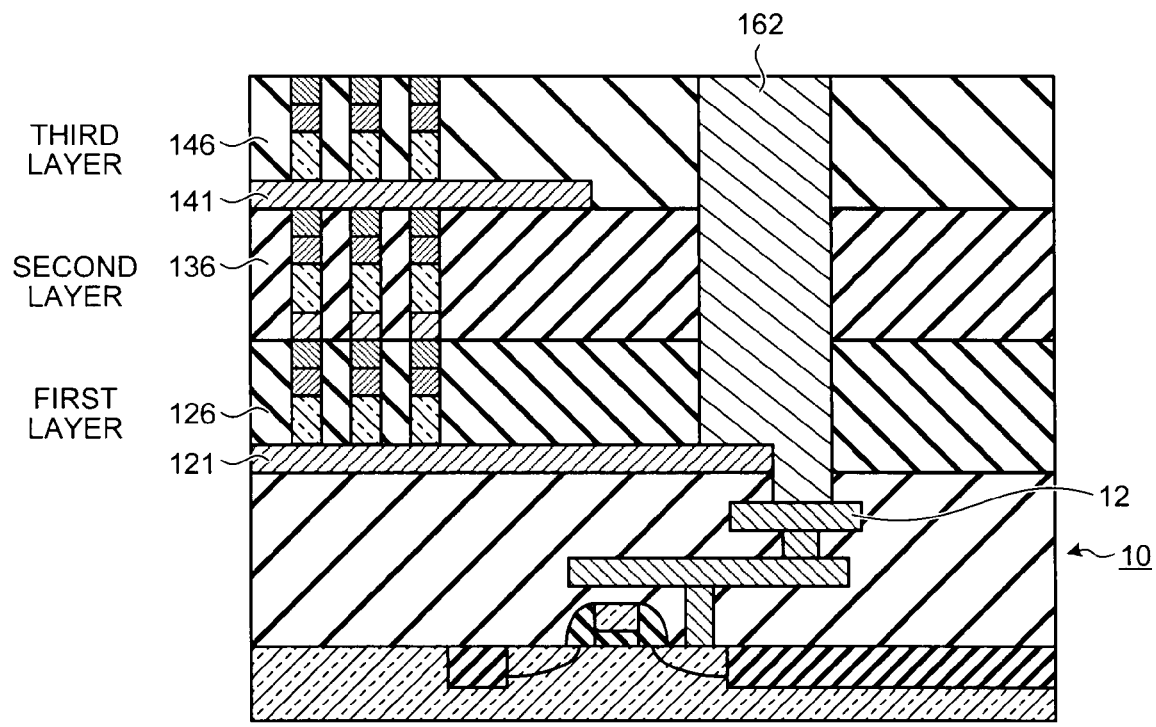

FIGS. 5I and 5J are sectional views for explaining an example of formation of the connection vias. FIG. 5I is a main part sectional view corresponding to FIG. 1N. FIG. 5J is a main part sectional view corresponding to FIG. 1O. As shown in FIG. 5I, a connection via 161 is a connection via connected from the surface of the silicon oxide film 146 to the tungsten film 131 as the second wiring layer and reaching the wire 12 in the transistor layer of the semiconductor substrate 10. As shown in FIG. 5J, a connection via 162 is a connection via connected from the surface of the silicon oxide film 146 to the tungsten film 121 as the first wiring layer and reaching the wire 12 in the transistor layer of the semiconductor substrate 10.

Subsequently, closed-loop cut (cutting) for the wiring layers of the respective layers is carried out. Because the wiring layers of the respective layers are formed by the sidewall transfer process, the wiring layers are formed in a closed-loop shape. To make the wires in the memory cell array region electrically independent one by one, the wiring layers formed in the closed-loop shape need to be closed-loop cut in a predetermined cutting region. In this embodiment, the closed-loop cut is collectively performed in one processing in a plurality of element layers rather than being performed for each of the wiring layers of the respective layers. Specifically, after wires having the closed-loop shape are formed in the element layers by the sidewall transfer process, a hole piercing through from an upper layer to a lower layer is formed by dry etching, whereby the closed-loop cut for the wiring layers formed in the element layers is collectively performed by one processing.

Figure 5K:
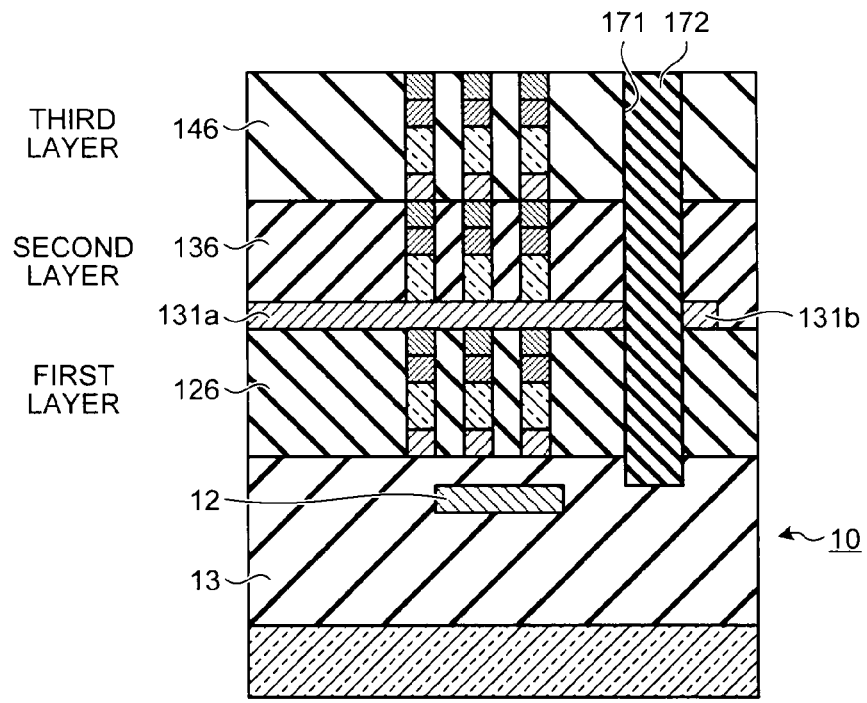
Figure 5L:
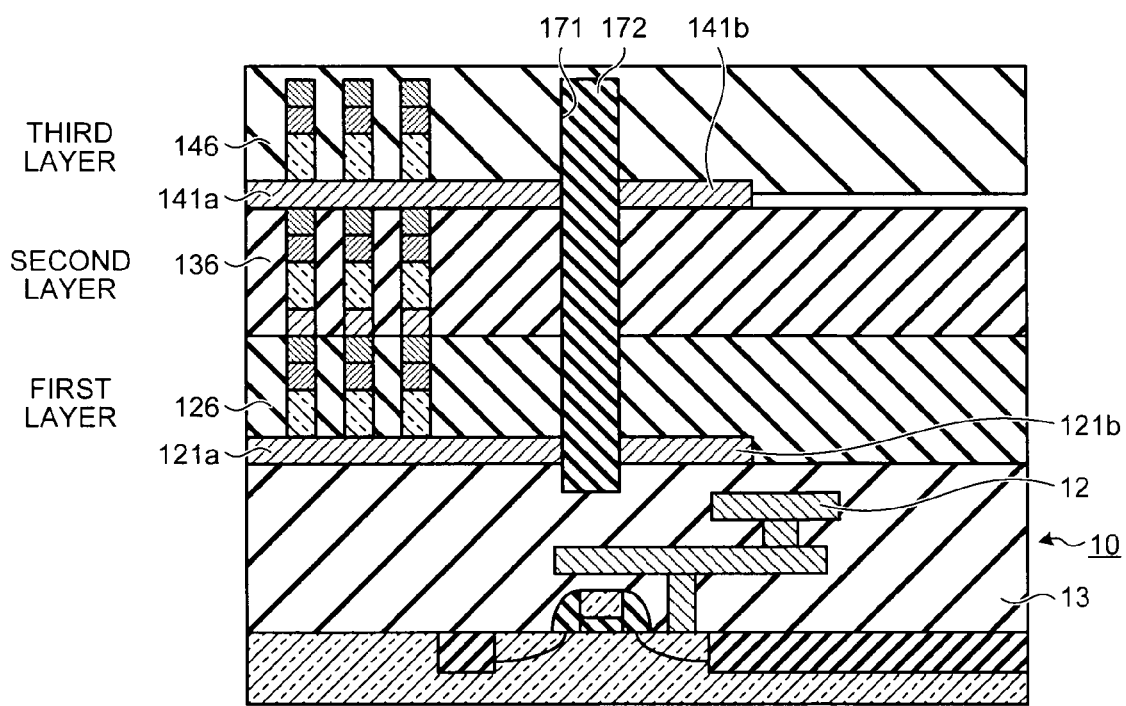

Specifically, as shown in FIGS. 5K and 5L, a plurality of closed-loop cut holes 171 reaching from the surface of the silicon oxide film 146 to the insulating layer 13 in the transistor layer of the semiconductor substrate 10 are formed by using the RIE method in the same manner as the formation of the connection vias. The closed-loop cut holes 171 are filled with an insulating material 172. FIGS. 5K and 5L are sectional views for explaining an example of the closed-loop cut. FIG. 5K is a main part sectional view corresponding to FIG. 1P. FIG. 5L is a main part sectional view corresponding to FIG. 1Q.

As shown in FIG. 5K, the tungsten film 131 as the second wiring layer is electrically divided into a tungsten film 131*a* and a tungsten film 131*b* when the closed-loop cut hole 171 is formed and the inside of the closed-loop cut hole 171 is filled with the insulating material 172. As shown in FIG. 5L, the tungsten film 121 as the first wiring layer and the tungsten film 141 as the third wiring layer are respectively electrically divided into tungsten films 121*a* and 121*b* and tungsten films 141*a* and 141*b* when the closed-loop cut hole 171 is formed and the inside of the closed-loop cut hole 171 is filled with the insulating material 172. The closed-loop cut hole 171 only has to have depth enough for piercing through a plurality of wiring layers located in a lower portion of a forming place of the closed-loop cut hole 171 and closed-loop cutting the wiring layers. Because the closed-loop cut hole 171 has a large aspect ratio, it is advisable to fill the closed-loop cut hole 171 with PSZ.

The forming place (a cutting place) for the closed-loop cut hole 171 is explained. In the case of the example shown in FIG. 6, in regions deviating from the memory cell array, cut regions are an end region 173 where a folded end of the thin patterns extending in parallel in the tungsten film 121 as the first wiring layer (one end in a longitudinal direction of the first wiring layer) and a folded end of the thin patterns extending in parallel in the tungsten film 141 as the third wiring layer (one end in a longitudinal direction of the third wiring layer) overlap in the laminating direction, an end region 174 where the thin patterns extending in parallel in the tungsten film 131 as the second wiring layer are folded, a center region 175 in the in-plane direction of the semiconductor substrate 10 in a contact section 121*c* provided to be connected to the tungsten film 121 as the first wiring layer, a center region 176 in the in-plane direction of the semiconductor substrate 10 in a contact section 131*c* provided to be connected to the tungsten film 131 as the second wiring layer, and a center region 177 in the in-plane direction of the semiconductor substrate 10 in a contact section 141*c* provided to be connected to the tungsten film 141 as the third wiring layer.

In this way, in the example shown in FIG. 6, the first wiring layer and the third wiring layer among the three wiring layers are formed to overlap each other in the laminating direction at one end in the longitudinal direction of the wiring layers. One end in the longitudinal direction of the wiring layers is formed as a cut region and the closed-loop cut hole 171 is formed, whereby both the first wiring layer and the third wiring layer are cut. In this example, the wiring layers of the two layers are formed to overlap each other at one end in the longitudinal direction. However, the wiring layers of three or more layers can also be formed to overlap one another. The first wiring layer and the third wiring layer among the wiring layers of the three layers can also be formed not to overlap each other in the laminating direction at the other end in the longitudinal direction of the wiring layers. The closed-loop cut holes 171 for dividing the contact sections 121*c*, 131*c*, and 141*c* are separately processed, whereby contact sections with drawing-out wires are formed in independent wiring layers after the closed-loop cut in the first, second, and third wiring layers.

The closed-loop cut holes 171 reaching from the surface of the silicon oxide film 146 to the insulating layer 13 in the transistor layer of the semiconductor substrate 10 are simultaneously formed in the respective cut regions by the RIE method, whereby the closed-loop cut for the first wiring layer, the second wiring layer, and the third wiring layer is collectively performed by one processing. The closed-loop cut holes 171 are filled with the insulating material.

Subsequently, the extra insulating material filling the closed-loop cut holes 171 is removed by the CMP processing to expose the connection vias 161 and 162 and the tungsten film 145 in the upper part of the element layer. A fourth element layer and a fifth element layer are formed by repeating the same process. After the formation of the fifth element layer, formation of connection vias and closed-loop cut for the second time are performed in the same manner. The formation of element layers, the formation of connection vias, and the closed-loop cut are repeated and, lastly, formation a wires for bonding and a passivation film is performed. This makes it possible to obtain a nonvolatile storage device having structure in which columnar memory cells are held between upper and lower wiring layers and the memory cells are laminated three-dimensionally.

According to the second embodiment, the wiring layers of a plurality of layers having the closed-loop shape formed by the sidewall transfer process and three-dimensionally laminated via the memory cells are collectively cut in the same process (closed-loop cut). Therefore, there is an effect that it is possible to reduce the number of steps and the number of used mask layers required for the closed-loop cut for the wiring layers and reduce cost.

In the above explanation, the actual substance names are referred to and the embodiment is specifically explained as in the first embodiment. However, types of insulating films, conductive members, and the like including not only those directly included in an electronic component but also a core material, a sidewall material, and a mask material in the sidewall transfer processing are not limited to the materials explained above and can be changed as appropriate. The number of layers for which the closed-loop cut is simultaneously processed is not limited to three and can be an arbitrary number. The order of the formation of connection vias and the closed-loop cut is not specifically limited.

The embodiments are explained with the cross-point type ReRAM as an example. However, the present embodiments can be widely applied to manufacturing of an electronic component having wires in a plurality of layers formed by the sidewall transfer process.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A method of manufacturing an electronic component, comprising:
    forming a lower wiring layer using a first sidewall transfer process, the first sidewall transfer process including:
        forming a first sidewall film having a closed loop along a first sidewall of a first sacrificed pattern formed on a first base material,
        removing the first sacrificed pattern to leave the first sidewall film, and
        selectively removing the first base material using the first sidewall film as a mask to form the lower wiring layer;
    forming one or more upper wiring layers located in a higher position than the lower wiring layer via another layer which is on the lower wiring layer using a second sidewall transfer process, the second sidewall transfer process including:
        forming a second sidewall film having a closed loop along a second sidewall of a second sacrificed pattern formed on a second base material,
        removing the second sacrificed pattern to leave the second sidewall film, and
        selectively removing the second base material using the second sidewall film as a mask to form the one or more upper wiring layers; and
    collectively performing etching for cutting each of the lower wiring layer and the one or more upper wiring layers to thereby apply a closed-loop cut to the lower wiring layer and the one or more upper wiring layers.

2. The method of manufacturing an electronic component according to claim 1, wherein the performing etching includes cutting each of the lower wiring layer and the one or more upper wiring layers to collectively form, with a reactive ion etching (RIE) method, a plurality of holes reaching at least a layer located in a lower position than the lower wiring layer.

3. The method of manufacturing an electronic component according to claim 2, wherein the etching is performed such that the lower wiring layer and at least one of the upper wiring layers are formed to overlap each other in a laminating direction at one end in a longitudinal direction of the lower wiring layer and the at least one of the upper wiring layers, and a hole is formed for cutting both the lower wiring layer and the at least one of the upper wiring layers at one end in the longitudinal direction.

4. The method of manufacturing an electronic component according to claim 3, wherein
    the lower wiring layer and at least one of the upper wiring layers are formed not to overlap each other in the laminating direction at the other end in the longitudinal direction of the lower wiring layer and the at least one of the upper wiring layers, and the other end in the longitudinal direction is formed as a contact section with a drawing-out wire after holes for cutting the lower wiring layer and the at least one of the upper wiring layers are respectively formed.

5. The method of manufacturing an electronic component according to claim 3, wherein the lower wiring layer and at least one of the upper wiring layers extend in different directions and are formed not to overlap each other in the laminating direction at one end and the other end in the longitudinal direction of the lower wiring layer and the at least one of the upper wiring layers, and the other end in the longitudinal direction of each of the lower wiring layer and the at least one of the upper wiring layers is formed as a contact section with a drawing-out wire after holes for cutting the lower wiring layer and the at least one of the upper wiring layers are respectively formed.

6. The method of manufacturing an electronic component according to claim 2, wherein the holes are filled with an insulating material.

7. The method of manufacturing an electronic component according to claim 1, wherein a first wiring layer as the lower wiring layer extends in a first direction and a second wiring layer as the upper wiring layer located above the lower wiring layer extends in a second direction, and wherein
    the method further includes forming a first nonvolatile memory cell comprising a first nonvolatile storage element and a first rectifying element as the other layer between the first wiring layer and the second wiring layer in a position where the first wiring layer and the second wiring layer cross each other.

8. The method of manufacturing an electronic component according to claim 7, further comprising forming a first variable resistance element as the first nonvolatile storage element, and forming a first diode as the first rectifying element.

9. The method of manufacturing an electronic component according to claim 8, further comprising forming the first variable resistance element and the first diode by using the first sidewall transfer process which forms the first wiring layer as the lower wiring layer and the second sidewall transfer process which forms the second wiring layer as the upper wiring layer.

10. The method of manufacturing an electronic component according to claim 8, further comprising forming the first variable resistance element and the first diode by using an individual process which forms the first variable resistance element and the first diode that uses a lithography process and an etching different from the first sidewall transfer process and the second sidewall transfer process, between the first sidewall transfer process which forms the first wiring layer and the second sidewall transfer process which forms the second wiring layer.

11. The method of manufacturing an electronic component according to claim 7, wherein a third wiring layer as the upper wiring layer located immediately above the second wiring layer extends in the first direction, and wherein the method further comprising forming a second nonvolatile memory cell including a second nonvolatile storage element and a second rectifying element as the other layer between the second wiring layer and the third wiring layer in a position where the second wiring layer and the third wiring layer cross each other.

12. The method of manufacturing an electronic component according to claim 11, further comprising forming a second variable resistance element as the second nonvolatile storage element, and forming a second diode as the second rectifying element.

13. The method of manufacturing an electronic component according to claim 11, further comprising forming the second variable resistance element and the second diode by using the second sidewall transfer process which forms the second wiring layer, and further comprising a third sidewall transfer process which forms the third wiring layer, the third sidewall transfer process including:

forming a third sidewall film having a closed loop along a third sidewall of a third sacrificed pattern formed on a third base material, removing the third sacrificed pattern to leave the third sidewall film, and selectively removing the third base material using the third sidewall film as a mask to form the third wiring layer.

14. The method of manufacturing an electronic component according to claim 13, further comprising forming the second variable resistance element and the second diode by using an individual process which forms the second variable resistance element and the second diode, the individual process using a lithography process and an etching process different from the second sidewall transfer process and the third sidewall transfer process, between the second sidewall transfer process which forms the second wiring layer and the third sidewall transfer process which forms the third wiring layer.

15. The method of manufacturing an electronic component according to claim 1, wherein a barrier metal is formed at least one of right above or right below the lower wiring layer.

16. The method of manufacturing an electronic component according to claim 1, wherein a barrier metal is formed at least one of right above or right below the upper wiring layer.

* * * * *